United States Patent
Kim et al.

(10) Patent No.: US 11,329,120 B2
(45) Date of Patent: May 10, 2022

(54) ORGANIC LIGHT EMITTING DIODE DISPLAY DEVICE

(71) Applicant: Samsung Display Co., Ltd., Yongin-Si (KR)

(72) Inventors: Young Dae Kim, Seoul (KR); Jin Seock Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 155 days.

(21) Appl. No.: 16/896,608

(22) Filed: Jun. 9, 2020

(65) Prior Publication Data

US 2021/0104592 A1 Apr. 8, 2021

(30) Foreign Application Priority Data

Oct. 2, 2019 (KR) .................. 10-2019-0122099

(51) Int. Cl.
*H01L 27/32* (2006.01)
*H01L 51/52* (2006.01)

(52) U.S. Cl.
CPC ........ *H01L 27/3276* (2013.01); *H01L 27/326* (2013.01); *H01L 51/5237* (2013.01); *H01L 2251/301* (2013.01)

(58) Field of Classification Search
CPC ................. H01L 27/3276; H01L 27/3218
See application file for complete search history.

(56) References Cited

U.S. PATENT DOCUMENTS

| 2015/0008406 | A1* | 1/2015 | Furuie | H01L 51/5253 257/40 |
| 2017/0168616 | A1* | 6/2017 | Feng | G06F 3/0443 |
| 2017/0244069 | A1* | 8/2017 | Kim | H01L 51/56 |
| 2017/0294501 | A1* | 10/2017 | Jang | H01L 51/56 |
| 2020/0006697 | A1* | 1/2020 | Jung | H01L 51/5243 |

FOREIGN PATENT DOCUMENTS

| KR | 101943687 B1 | 1/2019 |
| KR | 1020190048784 A | 5/2019 |
| KR | 1020190065757 A | 6/2019 |

* cited by examiner

*Primary Examiner* — Douglas M Menz
(74) *Attorney, Agent, or Firm* — Cantor Colburn LLP

(57) ABSTRACT

An organic light emitting diode display device includes a substrate, a pixel structure, a lower blocking member, an upper blocking member, and a metal member. The substrate includes a display area and a peripheral area. The pixel structure is in the display area on the substrate. The lower blocking member is in the peripheral area on the substrate and surrounds the pixel structure, and includes a first side surface adjacent to the pixel structure, a second side surface, and a top surface. The upper blocking member is on the top surface and the second side surface of the lower blocking member, and constitutes a first blocking structure with the lower blocking member. The metal member is between the first blocking structure and the substrate while making contact with a bottom surface of the upper blocking member on the second side surface of the lower blocking member.

20 Claims, 15 Drawing Sheets

ORGANIC LIGHT EMITTING DIODE DISPLAY DEVICE

This application claims priority to Korean Patent Application No. 10-2019-0122099, filed on Oct. 2, 2019, and all the benefits accruing therefrom under 35 U.S.C. § 119, the content of which in its entirety is herein incorporated by reference.

BACKGROUND

1. Field

Exemplary embodiments relate generally to an organic light emitting diode display device. More particularly, exemplary embodiments of the invention relate to an organic light emitting diode display device including a blocking member.

2. Description of the Related Art

Flat panel display devices are replacing a cathode ray tube display device due to lightweight and thin characteristics thereof. Such flat panel display devices include a liquid crystal display device and an organic light emitting diode display device, for example.

Recently, a flexible organic light emitting diode display device has been developed. In the organic light emitting diode display device, a lower substrate and an upper substrate are formed of a flexible material so that a portion of the organic light emitting diode display device may be bent or folded. The lower substrate may include a flexible substrate, and the upper substrate may include a thin film encapsulation structure, for example. In this case, the thin film encapsulation structure may have a structure in which an inorganic layer and an organic layer are alternately stacked, and a blocking structure may be disposed at an outer peripheral portion of the flexible organic light emitting diode display device to prevent reflow of the organic layer.

SUMMARY

As an etchant used in a process of manufacturing a lower electrode of a flexible organic light emitting diode display device is changed, roughness of an insulating layer disposed under the blocking structure may be relatively reduced, so that a contact surface between a blocking structure and an insulating layer may be reduced, which may cause contact failure, and a failure of the flexible organic light emitting diode display device may occur as a result.

Some exemplary embodiments provide an organic light emitting diode display device including a blocking member.

According to an exemplary embodiment, an organic light emitting diode display device includes a substrate, a pixel structure, a lower blocking member, an upper blocking member, and a metal member. The substrate includes a display area and a peripheral area. The pixel structure is disposed in the display area on the substrate. The lower blocking member is disposed in the peripheral area on the substrate and surrounds the pixel structure, and includes a first side surface adjacent to the pixel structure, a second side surface opposite to the first side surface, and a top surface disposed between the first side surface and the second side surface. The upper blocking member is disposed on the top surface and the second side surface of the lower blocking member, and constitutes a first blocking structure together with the lower blocking member. The metal member is disposed between the first blocking structure and the substrate and contacts a bottom surface of the upper blocking member disposed on the second side surface of the lower blocking member.

In an exemplary embodiment, the organic light emitting diode display device may further include an insulating interlayer disposed between the first blocking structure and the substrate, and the insulating interlayer may include an inorganic material. The metal member may be disposed between the bottom surface of the upper blocking member and the insulating interlayer and prevent the bottom surface of the upper blocking member from contacting the insulating interlayer.

In an exemplary embodiment, the organic light emitting diode display device may further include a second blocking structure disposed in the peripheral area while being spaced apart from the first side surface of the lower blocking member in a first direction, which is a direction from the peripheral area to the display area, on the substrate.

In an exemplary embodiment, the organic light emitting diode display device may further include a first power supply line disposed between the second blocking structure and the substrate.

In an exemplary embodiment, the organic light emitting diode display device may further include a connection electrode disposed between the second blocking structure and the first power supply line, and the connection electrode may extend in a second direction opposite to the first direction and be disposed on the first side surface and at least a portion of the top surface of the lower blocking member.

In an exemplary embodiment, the upper blocking member may extend in the first direction and be disposed on the first side surface of the lower blocking member, and a bottom surface of the upper blocking member disposed on the first side surface of the lower blocking member may contact the connection electrode.

In an exemplary embodiment, the upper blocking member may completely overlap the lower blocking member in a plan view such that the lower blocking member is prevented from being exposed.

In an exemplary embodiment, the connection electrode may extend in the second direction and be disposed on the second side surface of the lower blocking member, and the connection electrode may contact the metal member.

In an exemplary embodiment, the connection electrode may completely overlap the lower blocking member in a plan view such that the lower blocking member is prevented from being exposed.

In an exemplary embodiment, the organic light emitting diode display device may further include a semiconductor element disposed in the display area while being spaced apart from the first power supply line in the first direction on the substrate and a second power supply line disposed between the first power supply line and the semiconductor element on the substrate.

In an exemplary embodiment, the pixel structure may include a lower electrode disposed on the semiconductor element, a light emitting layer disposed on the lower electrode, and an upper electrode disposed on the light emitting layer, and the connection electrode may extend in the first direction and contact the upper electrode.

In an exemplary embodiment, the organic light emitting diode display device may further include a first inorganic thin film encapsulation layer, an organic thin film encapsulation layer, and a second inorganic thin film encapsulation layer. The first inorganic thin film encapsulation layer may be disposed on the upper electrode, the first blocking structure, and the second blocking structure, and the organic thin film encapsulation layer may be disposed on the first inorganic thin film encapsulation layer. The second inorganic thin film encapsulation layer may be disposed on the first inorganic thin film encapsulation layer and the organic thin film encapsulation layer, and may constitute a thin film encapsulation structure together with the first inorganic thin film encapsulation layer and the organic thin film encapsulation layer.

According to an exemplary embodiment, an organic light emitting diode display device includes a substrate, a pixel structure, a lower blocking member, an upper blocking member, and a connection electrode. The substrate includes a display area and a peripheral area. The pixel structure is disposed in the display area on the substrate. The lower blocking member is disposed in the peripheral area on the substrate and surrounds the pixel structure, and includes a first side surface adjacent to the pixel structure, a second side surface opposite to the first side surface, and a top surface disposed between the first side surface and the second side surface. The upper blocking member is disposed on the lower blocking member, and constitutes a first blocking structure together with the lower blocking member. The connection electrode is disposed on the first side surface and the top surface of the lower blocking member while being disposed between the lower blocking member and the upper blocking member, and completely overlap the top surface of the lower blocking member in a plan view.

In an exemplary embodiment, the upper blocking member may extend in a first direction, which is a direction from the peripheral area to the display area and be disposed on the first side surface of the lower blocking member, and the bottom surface of the upper blocking member may be disposed on the first side surface of the lower blocking member and contact the connection electrode.

In an exemplary embodiment, the connection electrode may extend in a second direction opposite to the first direction and be disposed on the second side surface of the lower blocking member.

In an exemplary embodiment, the connection electrode may completely overlap the lower blocking member in the plan view such that the lower blocking member is prevented from being exposed.

In an exemplary embodiment, the upper blocking member may extend in the second direction and be disposed on the second side surface of the lower blocking member, and the bottom surface of the upper blocking member may be disposed on the second side surface of the lower blocking member and contact the connection electrode.

In an exemplary embodiment, the upper blocking member may completely overlap the lower blocking member in the plan view such that the lower blocking member is prevented from being exposed.

In an exemplary embodiment, the organic light emitting diode display device may further include an insulating interlayer disposed between the first blocking structure and the substrate, and the insulating interlayer may include an inorganic material. The connection electrode may be disposed between a bottom surface of the upper blocking member and the insulating interlayer and prevent the bottom surface of the upper blocking member from contacting the insulating interlayer.

In an exemplary embodiment, a plurality of grooves may be defined in the top surface of the lower blocking member.

The organic light emitting diode display device in the exemplary embodiments of the invention includes the metal member, so that the bottom surface of the upper blocking member disposed on the second side surface of the lower blocking member may directly contact a top surface of the metal member such that the upper blocking member does not directly contact the insulating interlayer. Accordingly, the delamination phenomenon may be prevented from occurring between the upper blocking member and the insulating interlayer.

The organic light emitting diode display device in the exemplary embodiments of the invention includes the connection electrode which completely overlaps the lower blocking member in a plan view, so that the bottom surface of the upper blocking member may contact the top surface of the connection electrode, and the upper blocking member may not contact the insulating interlayer. Accordingly, the delamination phenomenon may be prevented from occurring.

BRIEF DESCRIPTION OF THE DRAWINGS

Exemplary embodiments may be understood in more detail from the following description taken in conjunction with the accompanying drawings, in which.

DETAILED DESCRIPTION

Figure 1:
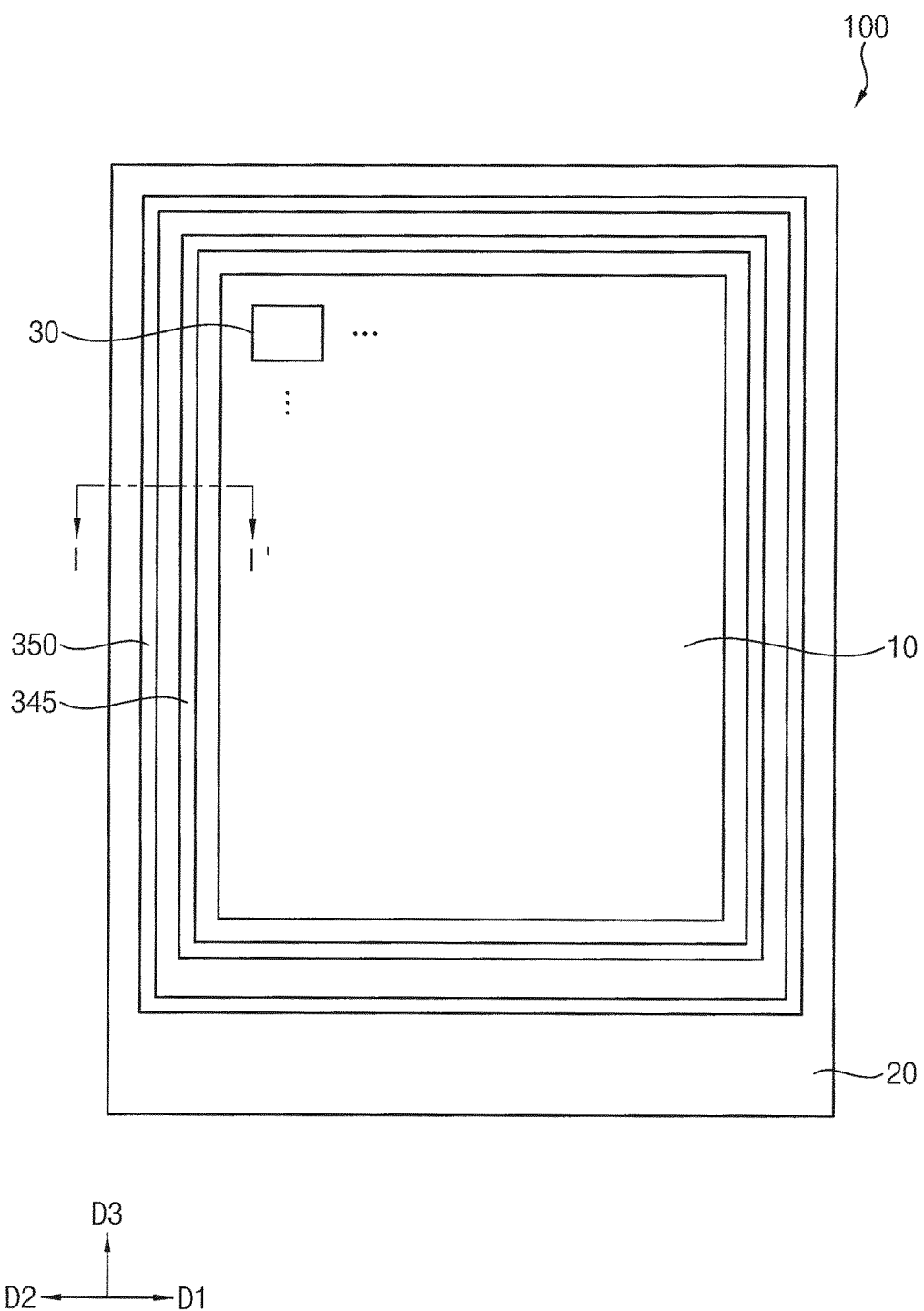
FIG. 1 is a plan view showing an exemplary embodiment of an organic light emitting diode display device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, organic light emitting diode display devices and a method of manufacturing an organic light emitting diode display device according to the invention will be described in detail with reference to the accompanying drawings. In the accompanying drawings, same or similar reference numerals refer to the same or similar elements.

FIG. 1 is a plan view showing an exemplary embodiment of an organic light emitting diode display device according to the invention.

Referring to FIG. 1, an organic light emitting diode display device 100 may include a display area 10 and a peripheral area 20 surrounding the display area 10. The display area 10 may include a plurality of pixel areas 30.

A pixel structure (e.g., a pixel structure 200 of FIG. 2) may be disposed in each of the pixel areas 30. An image (e.g., a video image) may be displayed in the display area 10 through pixel structures. Wires (e.g., gate line, data line, power supply line, etc.), a first blocking structure 350, a second blocking structure 345, and the like may be disposed in the peripheral area 20. The wires may extend in a direction from the peripheral area 20 to the display area 10 so as to be electrically connected to the pixel structures.

In the exemplary embodiments, the first blocking structure 350 may be disposed in the peripheral area 20, and the second blocking structure 345 may be spaced inward of the first blocking structure 350. In other words, the second blocking structure 345 may surround the display area 10, and the first blocking structure 350 may surround the second blocking structure 345 and the display area 10. In an exemplary embodiment, the first blocking structure 350 and the second blocking structure 345 may not contact each other, and may be parallel to each other, for example. A blocking structure (e.g., first and second blocking structures 350 and 345) may prevent leakage of an organic thin film encapsulation layer included in a thin film encapsulation structure which will be described below. In addition, the organic light emitting diode display device 100 includes a flexible substrate and the thin film encapsulation structure, so that the organic light emitting diode display device 100 may function as a flexible organic light emitting diode display device.

Although each of the display area 10, the peripheral area 20, and the pixel area 30 has been shown in FIG. 1 as having a rectangular shape in a plan view, the shapes of the display area 10, the peripheral area 20, and the pixel area 30 are not limited thereto. In an exemplary embodiment, each of the display area 10, the peripheral area 20, and the pixel area 30 may have a triangular shape, a rhombic shape, a polygonal shape, a circular shape, a track shape, or an elliptical shape in a plan view, for example.

Figure 2:
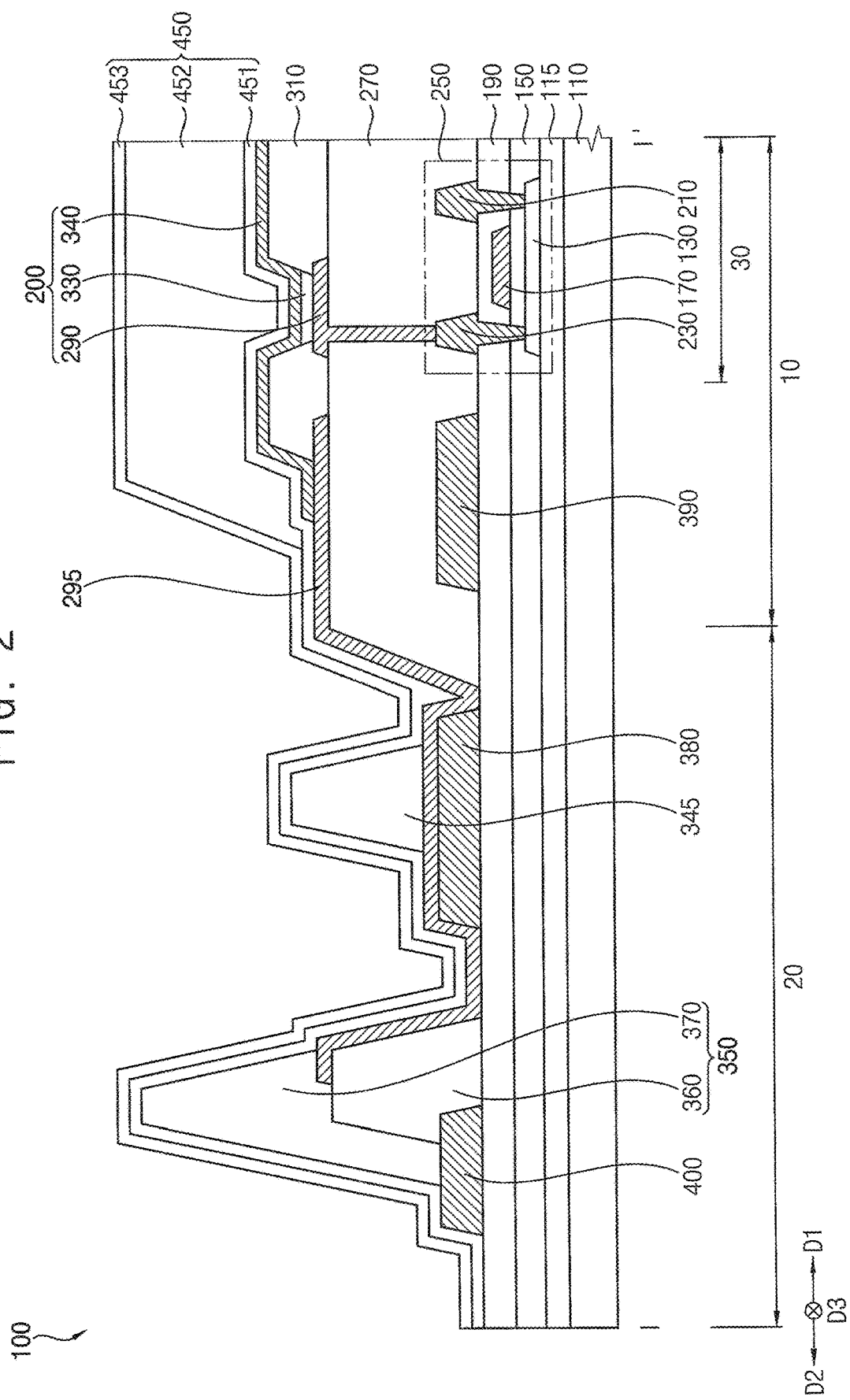
FIG. 2 is a cross-sectional view taken along line I-I' of FIG. 1.
Figure 3:
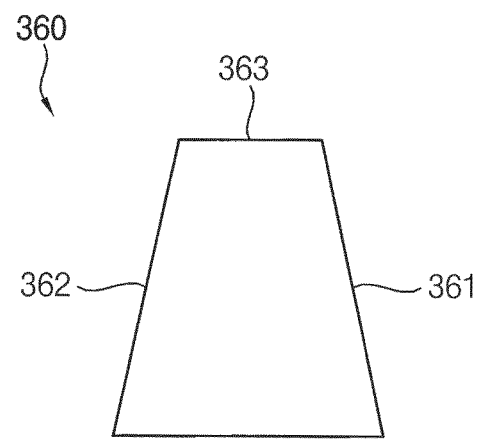
FIG. 3 is a plan view showing a lower blocking member included in the organic light emitting diode display device of FIG. 2.
Figure 3:
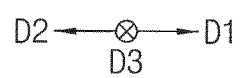

FIG. 2 is a cross-sectional view taken along line I-I' of FIG. 1, and FIG. 3 is a plan view showing a lower blocking member included in the organic light emitting diode display device of FIG. 2.

Referring to FIGS. 2 and 3, the organic light emitting diode display device 100 may include a substrate 110, a buffer layer 115, a semiconductor element 250, a first power supply line 380, a second power supply line 390, a metal member 400, a planarization layer 270, a first blocking structure 350, a second blocking structure 345, a pixel structure 200, a connection electrode 295, a pixel defining layer 310, a thin film encapsulation structure 450, and the like. In this case, the pixel structure 200 may include a lower electrode 290, a light emitting layer 330, and an upper electrode 340, and the semiconductor element 250 may include an active layer 130, a gate insulating layer 150, a gate electrode 170, an insulating interlayer 190, a source electrode 210, and a drain electrode 230. In addition, the thin film encapsulation structure 450 may include a first inorganic thin film encapsulation layer 451, an organic thin film encapsulation layer 452, and a second inorganic thin film encapsulation layer 453, and the first blocking structure 350 may include a lower blocking member 360 and an upper blocking member 370. Moreover, as shown in FIG. 3, the lower blocking member 360 may include a first side surface 361, a second side surface 362 opposite to the first side surface 361, and a top surface 363 disposed between the first side surface 361 and the second side surface 362, and the first side surface 361 may be adjacent to the pixel structure 200.

As described above, the organic light emitting diode display device 100 may include the display area 10 including the pixel areas 30 and the peripheral area 20 surrounding the display area 10. An image may be displayed through the pixel structure 200 in the pixel area 30, and the first blocking structure 350, the second blocking structure 345, the wires, and the like may be disposed in the peripheral area 20 which may correspond to a non-display area. A plurality of transistors (e.g., the semiconductor element 250), a plurality of capacitors, a plurality of wires, and the like may be additionally disposed in the display area 10. The organic light emitting diode display device 100 includes a flexible substrate 110 and the thin film encapsulation structure 450, so that the organic light emitting diode display device 100 may function as a flexible organic light emitting diode display device.

The substrate 110 including a transparent or opaque material may be provided. The substrate 110 may be configured as a transparent resin substrate. Examples of the transparent resin substrate that may be used as the substrate 110 include a polyimide substrate. In an exemplary embodiment, the substrate 110 may have a configuration in which a first organic layer, a first barrier layer, a second organic layer, and a second barrier layer are sequentially stacked, for example. The first barrier layer and the second barrier layer may include an inorganic material such as silicon oxide. In addition, the first organic layer and the second organic layer may include an organic material such as a polyimide-based resin. In an exemplary embodiment, each of the first and second organic layers may assist the substrate so that the substrate may have flexibility, and each of the first and second barrier layers may block moisture penetrating through the first and second organic layers, for example.

In a method of manufacturing the organic light emitting diode display device 100, the substrate 110 is thin and flexible, so that the substrate 110 may be disposed on a rigid glass to support the formation of an upper structure (e.g., the semiconductor element 250, the pixel structure 200, the thin film encapsulation structure 450, etc.). In an exemplary embodiment, after the buffer layer 115 is disposed on the second barrier layer, the upper structure may be disposed on the buffer layer 115, for example. After the upper structure is provided, the glass substrate may be removed. In other words, due to flexible physical properties of the substrate 110, it may be difficult to directly form the upper structure on the substrate 110. From this point of view, the upper structure is provided by a rigid glass substrate, and then the glass substrate is removed, so that the first organic layer, the first barrier layer, the second organic layer, and the second barrier layer may be used as the substrate 110. In some exemplary embodiments, the substrate 110 may include at least one of a quartz substrate, a synthetic quartz substrate, a calcium fluoride substrate, a fluorine-doped quartz substrate (F-doped quartz substrate), a soda lime glass substrate, a non-alkali glass substrate, etc., for example.

Although the substrate 110 has been described as including four layers, the configuration of the invention is not limited thereto. In other exemplary embodiments, the substrate 110 may include a single layer or a plurality of layers other than four layers, for example.

The organic light emitting diode display device 100 has the display area 10, the pixel area 30, and the peripheral area 20, so that the substrate 110 may also be divided into the display area 10, the pixel area 30, and the peripheral area 20.

The buffer layer 115 may be disposed on the substrate 110. The buffer layer 115 may be disposed over the substrate 110. The buffer layer 115 may prevent metal atoms or impurities from diffusing from the substrate 110 into the upper structure, and may control a heat transfer rate during a crystallization process for forming the active layer 130 to obtain a substantially uniform active layer 130. In addition, when a surface of the substrate 110 is not uniform, the buffer layer 115 may serve to improve flatness of the surface of the substrate 110. Depending on a type of the substrate 110, at least two buffer layers 115 may be provided on the substrate 110, or the buffer layer 115 may not be provided. The buffer layer 115 may include an organic material or an inorganic material. In the exemplary embodiments, the buffer layer 115 may include an inorganic material such as a silicon compound, metal oxide, etc. In an exemplary embodiment, the buffer layer 115 may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc., for example.

The active layer 130 may be disposed in the pixel area 30 on the buffer layer 115. The active layer 130 may include a metal oxide semiconductor, an inorganic semiconductor (e.g., amorphous silicon or poly silicon semiconductor), an organic semiconductor, etc., for example. The active layer 130 may include a source region and a drain region.

The gate insulating layer 150 may be disposed on the buffer layer 115 and the active layer 130. In an exemplary embodiment, the gate insulating layer 150 may sufficiently cover the active layer 130 in the display area 10 on the buffer layer 115, and may include a substantially flat top surface without creating a step around the active layer 130, for example. In an alternative exemplary embodiment, the gate insulating layer 150 may be disposed along a profile of the active layer 130 with a uniform thickness to cover the active layer 130 on the buffer layer 115. The gate insulating layer 150 may include a silicon compound, metal oxide, etc., for example. In other exemplary embodiments, the gate insulating layer 150 may have a multilayer structure including a plurality of insulating layers. In an exemplary embodiment, the insulating layers may have mutually different thicknesses or may include mutually different materials, for example.

The gate electrode 170 may be disposed in the pixel area 30 on the gate insulating layer 150. In other words, the gate electrode 170 may be disposed on a portion of the gate insulating layer 150 under which the active layer 130 is disposed. The gate electrode 170 may include a metal, a metal alloy, metal nitride, conductive metal oxide, a transparent conductive material, etc., for example, which may be used alone or in combination with each other. In other exemplary embodiments, the gate electrode 170 may have a multilayer structure including a plurality of metal layers. In an exemplary embodiment, the metal layers may have mutually different thicknesses or may include mutually different materials, for example.

The insulating interlayer 190 may be disposed on the gate insulating layer 150 and the gate electrode 170. In the exemplary embodiments, the insulating interlayer 190 and the upper blocking member 370 may not contact each other. The insulating interlayer 190 may sufficiently cover the gate electrode 170 in the display area 10 on the gate insulating layer 150, and may include a substantially flat top surface without creating a step around the gate electrode 170. In an alternative exemplary embodiment, the insulating interlayer 190 may be disposed along a profile of the gate electrode 170 with a uniform thickness to cover the gate electrode 170 on the gate insulating layer 150. The insulating interlayer 190 may include a silicon compound, metal oxide, etc., for example. In other exemplary embodiments, the insulating interlayer 190 may have a multilayer structure including a plurality of insulating layers. In an exemplary embodiment, the insulating layers may have mutually different thicknesses or may include mutually different materials, for example.

The source electrode 210 and the drain electrode 230 may be disposed in the pixel area 30 on the insulating interlayer 190. The source electrode 210 may be connected to the source region of the active layer 130 through a contact hole defined by removing first parts of the gate insulating layer 150 and the insulating interlayer 190, and the drain electrode 230 may be connected to the drain region of the active layer 130 through a contact hole defined by removing second parts of the gate insulating layer 150 and the insulating interlayer 190. Each of the source electrode 210 and the drain electrode 230 may include a metal, a metal alloy, metal nitride, conductive metal oxide, a transparent conductive material, etc., for example, which may be used alone or in combination with each other. In other exemplary embodiments, each of the source electrode 210 and the drain electrode 230 may have a multilayer structure including a plurality of metal layers. In an exemplary embodiment, the metal layers may have mutually different thicknesses or may include mutually different materials, for example.

Accordingly, the semiconductor element 250 including the active layer 130, the gate insulating layer 150, the gate electrode 170, the insulating interlayer 190, the source electrode 210, and the drain electrode 230 may be provided. In an exemplary embodiment, the semiconductor element 250 may be disposed in the display area 10 while being spaced apart from the first power supply line 380 in a first direction D1, which is a direction from the peripheral area 20 to the display area 10, on the substrate 110, for example.

Although the organic light emitting diode display device 100 has been described as having a configuration including one transistor (e.g., the semiconductor element 250), the configuration of the invention is not limited thereto. In an exemplary embodiment, the organic light emitting diode display device 100 may have a configuration including at least two transistors and at least one capacitor, for example.

In addition, although the semiconductor element 250 has been described as having a top gate structure, the configuration of the invention is not limited thereto. In an exemplary embodiment, the semiconductor element 250 may have a bottom gate structure and/or a double gate structure, for example.

The metal member 400 may be disposed in the peripheral area 20 on the insulating interlayer 190. In other words, the metal member 400 may be disposed at an outermost portion in the peripheral area 20 on the insulating interlayer 190. In the exemplary embodiments, the metal member 400 may be disposed between the first blocking structure 350 and the substrate 110 (or the insulating interlayer 190), and may directly contact a bottom surface of the upper blocking member 370 disposed on the second side surface 362 of the lower blocking member 360. In an exemplary embodiment, the metal member 400 may protrude from the second side surface 362 of the lower blocking member 360 in a direction from the display area 10 to the peripheral area 20 (e.g., a second direction D2) such that the upper blocking member 370 may not directly contact the insulating interlayer 190, for example. In other words, as shown in FIG. 1, the first blocking structure 350 has a shape surrounding the display area 10, so that the metal member 400 may also have a closed-loop shape surrounding the display area 10. In some exemplary embodiments, the metal member 400 may have a shape in which a closed-loop is partially open.

The metal member 400 may include a metal, a metal alloy, metal nitride, conductive metal oxide, a transparent conductive material, etc., for example. In an exemplary embodiment, the metal member 400 may include at least one of gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide ("ITO"), tin oxide ($SnO_x$), indium oxide ($InO_x$), gallium oxide ($GaO_x$), indium zinc oxide ("IZO"), etc., for example. The metal member 400 may have a multilayer structure including a plurality of metal layers. In an exemplary embodiment, the metal layers may have mutually different thicknesses or may include mutually different materials.

In a conventional method of manufacturing an organic light emitting diode display device, a first etchant used in a process of forming a lower electrode may include phosphoric acid, nitric acid, acetic acid, and the like, for example. When the lower electrode is etched by the first etchant, a portion of the insulating interlayer may be etched by the first etchant, so that a top surface of the insulating interlayer may have relatively high roughness (e.g., the top surface of the insulating interlayer may not be uniform or may have concavo-convex portions). Accordingly, even when the upper blocking member is disposed on the insulating interlayer located in the peripheral area after the lower electrode is formed, a contact area between the top surface of the insulating interlayer and the bottom surface of the upper blocking member is relatively increased, so that the upper blocking member is rarely separated from the insulating interlayer.

In the method of manufacturing the organic light emitting diode display device 100 according to the invention, the lower electrode 290 may have a stacked structure in which ITO/Ag/ITO are stacked. In a process of etching the lower electrode 290, the lower electrode 290 may be etched by a second etchant to prevent Ag particles from being reprecipitated from the lower electrode 290 due to Ag reduction. In this case, the second etchant may include nitric acid, acetic acid, and the like except for phosphoric acid. When the lower electrode 290 is etched by the second etchant, the insulating interlayer 190 may not be etched by the second etchant. In other words, the top surface of the insulating interlayer 190 may have relatively low roughness (e.g., the insulating interlayer 190 may have a uniform or flat top surface). Accordingly, when the upper blocking member 370 is disposed on the insulating interlayer 190 disposed in the peripheral area 20 after the lower electrode 290 is disposed, the contact area between the top surface of the insulating interlayer 190 and the bottom surface of the upper blocking member 370 may be relatively reduced, so that the upper blocking member 370 may be separated from the insulating interlayer 190 (e.g., a delamination phenomenon). In the exemplary embodiments, the bottom surface of the upper blocking member 370 contacts the metal member 400 after the metal member 400 is disposed, so that adhesion between the upper blocking member 370 and the metal member 400 may be relatively increased. In an exemplary embodiment, the adhesion between the upper blocking member 370 including an organic material and the metal member 400 including a metal may be greater than adhesion between the upper blocking member 370 including an organic material and the insulating interlayer 190 including an inorganic material, for example. Accordingly, the organic light emitting diode display device 100 includes the metal member 400, so that the delamination phenomenon may be prevented from occurring between the upper blocking member 370 and the insulating interlayer 190.

The first power supply line 380 may be disposed in the peripheral area 20 on the insulating interlayer 190 while being spaced apart from the metal member 400 in the first direction D1. In other words, the first power supply line 380 may be adjacent to a boundary between the display area 10 and the peripheral area 20. In addition, the first power supply line 380 may be provided with a low power supply voltage. In this case, the low power supply voltage may be applied to the upper electrode 340 through the connection electrode 295. In an exemplary embodiment, the first power supply line 380 may include a metal, a metal alloy, metal nitride, conductive metal oxide, a transparent conductive material, etc., for example, which may be used alone or in combination with each other. In other exemplary embodiments, the first power supply line 380 may have a multilayer structure including a plurality of metal layers. In an exemplary embodiment, the metal layers may have mutually different thicknesses or may include mutually different materials, for example.

The second power supply line 390 may be disposed in the display area 10 on the insulating interlayer 190. In other words, the second power supply line 390 may be adjacent to the boundary between the display area 10 and the peripheral area 20, and may be disposed between the first power supply line 380 and the drain electrode 230 (or the semiconductor element 250) on the insulating interlayer 190. In addition, the second power supply line 390 may be provided with a high power supply voltage having a voltage level relatively higher than the low power supply voltage. In this case, the high power supply voltage may be applied to the lower electrode 290. In an exemplary embodiment, the second power supply line 390 may include a metal, a metal alloy, metal nitride, conductive metal oxide, a transparent conductive material, etc., for example, which may be used alone or in combination with each other. In other exemplary embodiments, the second power supply line 390 may have a multilayer structure including a plurality of metal layers. In an exemplary embodiment, the metal layers may have mutually different thicknesses or may include mutually different materials, for example.

In the exemplary embodiments, the metal member 400, the first power supply line 380, the second power supply line 390, the source electrode 210, and the drain electrode 230 may be disposed in the same layer, and may be simultaneously provided by the same material. In other exemplary embodiments, the organic light emitting diode display device 100 may further include a plurality of wires disposed in the display area 10. In an exemplary embodiment, the wires may be disposed between the first power supply line 380 and the drain electrode 230, for example.

The planarization layer 270 may be disposed on the insulating interlayer 190, the second power supply line 390, the source electrode 210, and the drain electrode 230, and the planarization layer 270 may not overlap the first power supply line 380. In some exemplary embodiments, a portion of the planarization layer 270 may overlap at least a portion of the first power supply line 380. The planarization layer 270 may have a relatively thick thickness to sufficiently cover the second power supply line 390 and the source and drain electrodes 210 and 230 on the insulating interlayer 190. In this case, the planarization layer 270 may have a substantially flat top surface. In order to implement such a flat top surface of the planarization layer 270, a planarization process may be additionally performed on the planarization layer 270. In addition, a contact hole which exposes a top surface of the drain electrode 230 may be defined in the planarization layer 270. The planarization layer 270 may include an organic material or an inorganic material. In the exemplary embodiments, the planarization layer 270 may include an organic material.

The lower blocking member 360 may be disposed in the peripheral area 20 on the insulating interlayer 190 and a portion of the metal member 400. In other words, the lower blocking member 360 may overlap a portion of the metal member 400, and may surround the pixel structure 200. In addition, the lower blocking member 360 may serve to block leakage of the organic thin film encapsulation layer 452, and the lower blocking member 360 may be disposed in the same layer as the planarization layer 270. The lower blocking member 360 may include an organic material or an inorganic material. In the exemplary embodiments, the lower blocking member 360 may include an organic material, and the organic material may include at least one of a photoresist, a polyacryl-based resin, a polyimide-based resin, a polyamide-based resin, a siloxane-based resin, an acryl-based resin, an epoxy-based resin, etc., for example.

In the exemplary embodiments, the planarization layer 270 and the lower blocking member 360 may be simultaneously provided by the same material.

The lower electrode 290 may be disposed in the pixel area 30 on the planarization layer 270. The lower electrode 290 may directly contact the drain electrode 230 through the contact hole of the planarization layer 270, and the lower electrode 290 may be electrically connected to the semiconductor element 250. The lower electrode 290 may include a metal, a metal alloy, metal nitride, conductive metal oxide, a transparent conductive material, etc., for example, which may be used alone or in combination with each other. In other exemplary embodiments, the lower electrode 290 may have a multilayer structure including a plurality of metal layers. In an exemplary embodiment, the metal layers may have mutually different thicknesses or may include mutually different materials, for example.

The connection electrode 295 may be disposed on the planarization layer 270, the first power supply line 380, and a portion of the top surface 363 and the first side surface 361 of the lower blocking member 360. In other words, the connection electrode 295 may be spaced apart from the lower electrode 290 on the planarization layer 270 to extend in the second direction D2 (e.g., the direction from the display area 10 to the peripheral area 20) opposite to the first direction D1, and the connection electrode 295 may be disposed in the display area 10 and the peripheral area 20 adjacent to the boundary between the display area 10 and the peripheral area 20 on the substrate 110. The connection electrode 295 may be interposed between the second blocking structure 345 and the first power supply line 380 in the peripheral area 20, and a portion of the connection electrode 295 may be interposed between the lower blocking member 360 and the upper blocking member 370. In other words, the connection electrode 295 may be disposed on the first side surface 361 and a portion of the top surface 363 of the lower blocking member 360.

The connection electrode 295 may electrically connect the first power supply line 380 to the upper electrode 340, the connection electrode 295 may receive a low power supply voltage from the first power supply line 380, and the low power supply voltage may be applied to the upper electrode 340. The connection electrode 295 may include a metal, a metal alloy, metal nitride, conductive metal oxide, a transparent conductive material, etc., for example, which may be used alone or in combination with each other. In other exemplary embodiments, the connection electrode 295 may have a multilayer structure including a plurality of metal layers. In an exemplary embodiment, the metal layers may have mutually different thicknesses or may include mutually different materials, for example.

In the exemplary embodiments, the lower electrode 290 and the connection electrode 295 may be simultaneously provided by the same material.

The pixel defining layer 310 may be disposed on a portion of the lower electrode 290, a portion of the connection electrode 295, and the planarization layer 270. The pixel defining layer 310 may cover both sides of the lower electrode 290, and an opening which exposes a portion of a top surface of the lower electrode 290 may be defined in the pixel defining layer 310. The pixel defining layer 310 may include an organic material or an inorganic material. In the exemplary embodiments, the pixel defining layer 310 may include an organic material.

The upper blocking member 370 may be disposed on the metal member 400, the lower blocking member 360, and a portion of the connection electrode 295. In other words, the upper blocking member 370 may be disposed on the top surface 363 and the second side surface 362 of the lower blocking member 360, and the bottom surface of the upper blocking member 370 disposed on the second side surface 362 of the lower blocking member 360 may contact the metal member 400. The upper blocking member 370 may serve to block the leakage of the organic thin film encapsulation layer 452 together with the lower blocking member 360. The upper blocking member 370 may include an organic material or an inorganic material. In the exemplary embodiments, the upper blocking member 370 may include an organic material.

The second blocking structure 345 may be disposed in the peripheral area 20 on the connection electrode 295. In other words, the second blocking structure 345 may be disposed on a portion of the connection electrode 295 under which the first power supply line 380 is disposed while being spaced apart from the first side surface 361 of the lower blocking member 360 in the first direction D1 on the substrate 110. As shown in FIG. 1, the second blocking structure 345 may surround the display area 10. In the exemplary embodiments, the second blocking structure 345 may serve to block the leakage of the organic thin film encapsulation layer 452 together with the first blocking structure 350. The second blocking structure 345 may include an organic material or an inorganic material. In the exemplary embodiments, the second blocking structure 345 may include an organic material.

In the exemplary embodiments, the pixel defining layer 310, the second blocking structure 345, and the upper blocking member 370 may be simultaneously provided by the same material.

Accordingly, the first blocking structure 350 including the lower blocking member 360 and the upper blocking member 370 may be provided. As shown in FIG. 1, the first blocking structure 350 may be spaced apart from the second blocking structure 345 in the second direction D2, and the first blocking structure 350 may surround the second blocking structure 345.

In the conventional method of manufacturing the organic light emitting diode display device, depending on a manufacturing process margin, the upper blocking member may be disposed only on a top surface of the lower blocking member, may be disposed on the top surface and the first side surface of the lower blocking member, may be disposed on the top surface and the second side surface of the lower blocking member, or may be formed on the top surface and the first and second side surfaces of the lower blocking member, for example. In this case, when the upper blocking member is formed only on the top surface of the lower blocking member, the upper blocking member may not contact the insulating interlayer. In addition, when the upper blocking member is disposed on the top surface and the first side surface of the lower blocking member, the upper blocking member may not contact the insulating interlayer. In this case, the delamination phenomenon may not occur. However, when the blocking member is formed on the top surface and the second side surface of the lower blocking member, the bottom surface of the upper blocking member located on the second side surface may contact the insulating interlayer. In addition, when the blocking member is formed on the top surface and the first and second side surfaces of the lower blocking member, the bottom surface of the upper blocking member located on the second side surface may contact the insulating interlayer (e.g., since a bottom surface of the upper blocking member located on the first side surface of the lower blocking member is formed on the connection electrode, the delamination phenomenon may not occur). In this case, the delamination phenomenon may occur.

The organic light emitting diode display device 100 in the exemplary embodiments of the invention includes the metal member 400 disposed under the upper blocking member 370 disposed on the second side surface 362 of the lower blocking member 360, so that the upper blocking member 370 may not contact the insulating interlayer 190, and the delamination phenomenon may be prevented from occurring between the upper blocking member 370 and the insulating interlayer 190.

The light emitting layer 330 may be disposed on the lower electrode 290 exposed by the opening of the pixel defining layer 310. The light emitting layer 330 may be provided by at least one of light emitting materials for emitting different color lights (i.e., red light, green light, blue light, etc.)

according to sub-pixels. In an alternative exemplary embodiment, the light emitting layer 330 may be provided by stacking a plurality of light emitting materials for emitting different color lights such as red light, green light, and blue light to emit white light as a whole. In this case, a color filter may be disposed on the light emitting layer 330 (e.g., to overlap the light emitting layer 330 on a top surface of the thin film encapsulation structure 450). In an exemplary embodiment, the color filter may include at least one of a red color filter, a green color filter, and a blue color filter, for example, but is not limited thereto. In some exemplary embodiments, the color filter may include a yellow color filter, a cyan color filter, and a magenta color filter, for example. The color filter may include a photosensitive resin or a color photoresist.

The upper electrode 340 may be disposed on the pixel defining layer 310 and the light emitting layer 330. The upper electrode 340 may be disposed over the display area 10 on the substrate 110 to cover the light emitting layer 330 and the pixel defining layer 310. The upper electrode 340 may be electrically connected to the connection electrode 295 in the display area 10 adjacent to the boundary of the display area 10 and the peripheral area 20. The upper electrode 340 may include a metal, a metal alloy, metal nitride, conductive metal oxide, a transparent conductive material, etc., which may be used alone or in combination with each other. In other exemplary embodiments, the upper electrode 340 may have a multilayer structure including a plurality of metal layers. In an exemplary embodiment, the metal layers may have mutually different thicknesses or may include mutually different materials, for example.

Accordingly, the pixel structure 200 including the lower electrode 290, the light emitting layer 330, and the upper electrode 340 may be provided.

The first inorganic thin film encapsulation layer 451 may be disposed on the upper electrode 340, the connection electrode 295, the first blocking structure 350, the second blocking structure 345, the insulating interlayer 190, and the like. The first inorganic thin film encapsulation layer 451 may be disposed along a profile of the upper electrode 340, the connection electrode 295, the first blocking structure 350, and the second blocking structure 345 with a uniform thickness to cover the upper electrode 340, the connection electrode 295, the first blocking structure 350, and the second blocking structure 345. The first inorganic thin film encapsulation layer 451 may prevent the pixel structure 200 from being deteriorated due to penetration of moisture, oxygen, or the like. In addition, the first inorganic thin film encapsulation layer 451 may function to protect the pixel structure 200 from an external impact. The first inorganic thin film encapsulation layer 451 may include inorganic materials having flexibility.

The organic thin film encapsulation layer 452 may be disposed on the first inorganic thin film encapsulation layer 451. The organic thin film encapsulation layer 452 may improve flatness of the organic light emitting diode display device 100 and protect the pixel structure 200 together with the first inorganic thin film encapsulation layer 451. The organic thin film encapsulation layer 452 may include organic materials having flexibility.

The second inorganic thin film encapsulation layer 453 may be disposed on the organic thin film encapsulation layer 452. The second inorganic thin film encapsulation layer 453 may be disposed along a profile of the first inorganic thin film encapsulation layer 451 and the organic thin film encapsulation layer 452 with a uniform thickness to cover the organic thin film encapsulation layer 452. The second inorganic thin film encapsulation layer 453 may prevent the pixel structure 200 from being deteriorated due to the penetration of moisture, oxygen, or the like together with the first inorganic thin film encapsulation layer 451. In addition, the second inorganic thin film encapsulation layer 453 may function to protect the pixel structure 200 from an external impact together with the first inorganic thin film encapsulation layer 451 and the organic thin film encapsulation layer 452. The second inorganic thin film encapsulation layer 453 may include inorganic materials having flexibility.

Accordingly, the thin film encapsulation structure 450 including the first inorganic thin film encapsulation layer 451, the organic thin film encapsulation layer 452, and the second inorganic thin film encapsulation layer 453 may be provided.

In other exemplary embodiments, the thin film encapsulation structure 450 may have a five-layer structure provided by stacking three inorganic thin film encapsulation layers and two organic thin film encapsulation layers or a seven-layer structure provided by stacking four inorganic thin film encapsulation layers and three organic thin film encapsulation layers.

The organic light emitting diode display device 100 in the exemplary embodiments of the invention includes the metal member 400, so that the bottom surface of the upper blocking member 370 disposed on the second side surface 362 of the lower blocking member 360 may directly contact a top surface of the metal member 400 such that the upper blocking member 370 does not directly contact the insulating interlayer 190. Accordingly, the delamination phenomenon may be prevented from occurring between the upper blocking member 370 and the insulating interlayer 190.

FIGS. 4 to 10 are cross-sectional views showing an exemplary embodiment of a method of manufacturing an organic light emitting diode display device according to the invention.

Figure 4:
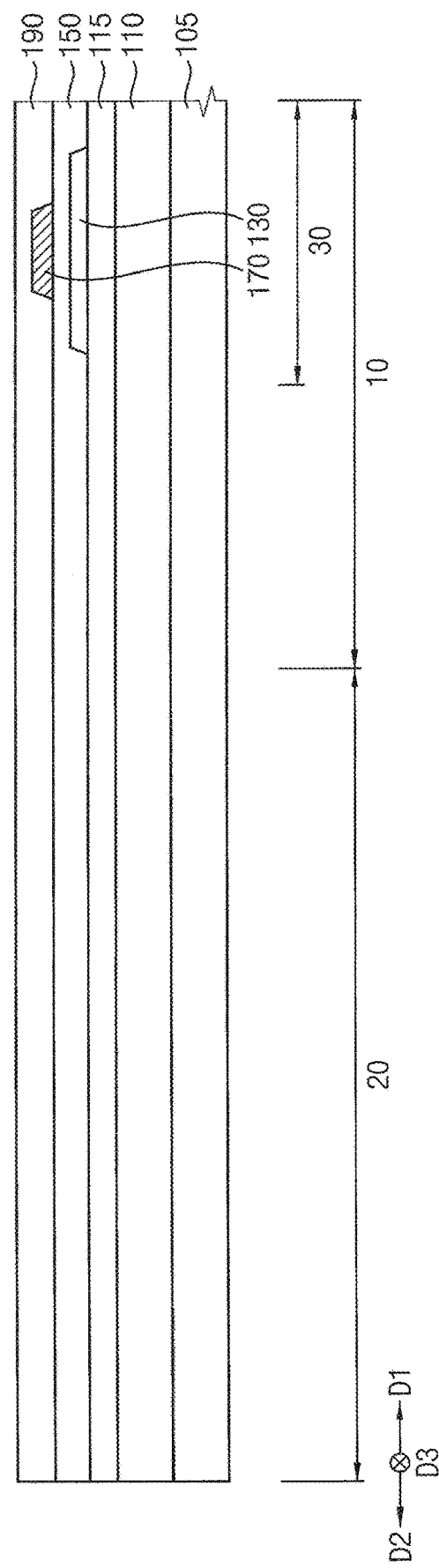
FIGS. 4 to 10 are cross-sectional views showing an exemplary embodiment of a method of manufacturing an organic light emitting diode display device according to the invention.

Referring to FIG. 4, a glass substrate 105 which is rigid may be provided. The substrate 110 including a transparent or opaque material may be disposed on the glass substrate 105. The substrate 110 may be configured as a transparent resin substrate having flexibility. In an exemplary embodiment, the substrate 110 may have a configuration in which a first organic layer, a first barrier layer, a second organic layer, and a second barrier layer are sequentially stacked, for example. The first barrier layer and the second barrier layer may be provided by an inorganic material such as silicon oxide, and the first organic layer and the second organic layer may be provided by an organic material such as a polyimide-based resin. The substrate 110 may be divided into a display area 10, a pixel area 30, and a peripheral area 20.

In some exemplary embodiments, the substrate 110 may be provided by at least one of a quartz substrate, a synthetic quartz substrate, a calcium fluoride substrate, an F-doped quartz substrate, a soda lime glass substrate, a non-alkali glass substrate, etc., for example.

The buffer layer 115 may be disposed on the substrate 110. The buffer layer 115 may be disposed over the substrate 110. Depending on a type of the substrate 110, at least two buffer layers 115 may be provided on the substrate 110, or the buffer layer 115 may not be provided. The buffer layer 115 may be provided by an inorganic material such as a silicon compound, metal oxide, etc. In an exemplary embodiment, the buffer layer 115 may include at least one of $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc., for example.

The active layer 130 may be disposed in the pixel area 30 on the buffer layer 115. The active layer 130 may be provided by at least one of a metal oxide semiconductor, an inorganic semiconductor, an organic semiconductor, etc., for example. The active layer 130 may include a source region and a drain region.

The gate insulating layer 150 may be disposed on the buffer layer 115 and the active layer 130. In an exemplary embodiment, the gate insulating layer 150 may sufficiently cover the active layer 130 in the display area 10 on the buffer layer 115, and may include a substantially flat top surface without creating a step around the active layer 130, for example. In an alternative exemplary embodiment, the gate insulating layer 150 may be disposed along a profile of the active layer 130 with a uniform thickness to cover the active layer 130 on the buffer layer 115. The gate insulating layer 150 may be provided by at least one of a silicon compound, metal oxide, etc., for example.

The gate electrode 170 may be disposed in the pixel area 30 on the gate insulating layer 150. In other words, the gate electrode 170 may be disposed on a portion of the gate insulating layer 150 under which the active layer 130 is disposed. The gate electrode 170 may be provided by a metal, a metal alloy, metal nitride, conductive metal oxide, a transparent conductive material, etc., for example, which may be used alone or in combination with each other.

The insulating interlayer 190 may be disposed on the gate insulating layer 150 and the gate electrode 170. The insulating interlayer 190 may sufficiently cover the gate electrode 170 in the display area 10 on the gate insulating layer 150, and may include a substantially flat top surface without creating a step around the gate electrode 170. In an alternative exemplary embodiment, the insulating interlayer 190 may be disposed along a profile of the gate electrode 170 with a uniform thickness to cover the gate electrode 170 on the gate insulating layer 150. The insulating interlayer 190 may be provided by at least one of a silicon compound, metal oxide, etc., for example.

Figure 5:
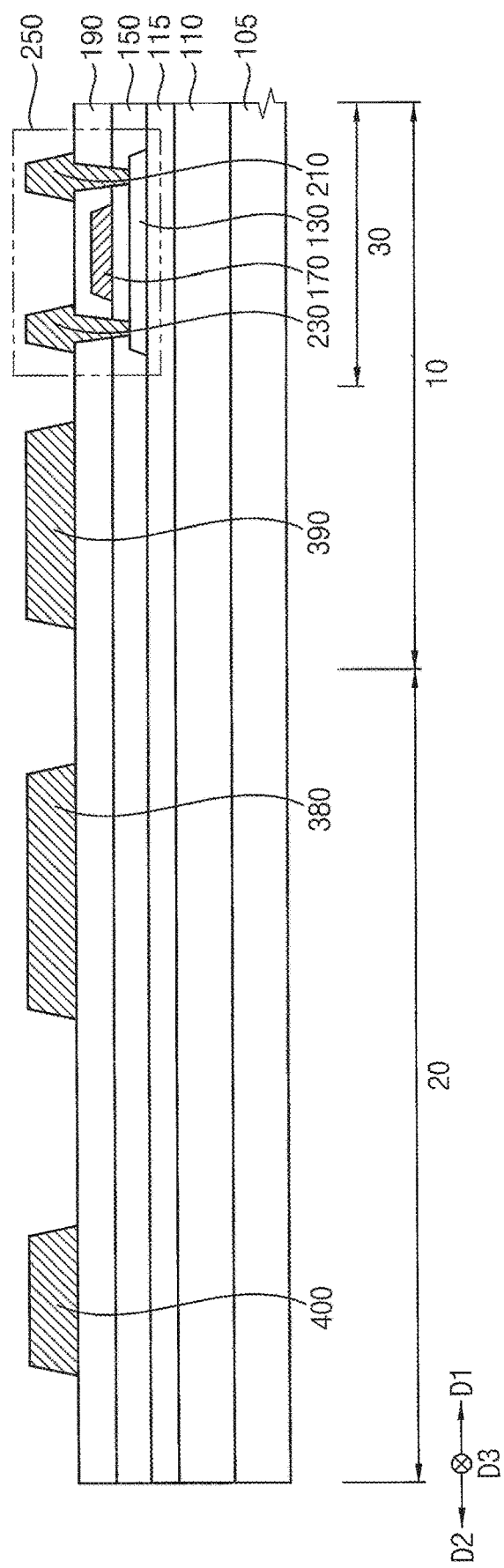

Referring to FIG. 5, the source electrode 210 and the drain electrode 230 may be disposed in the pixel area 30 on the insulating interlayer 190. The source electrode 210 may be connected to the source region of the active layer 130 through a contact hole defined by removing first parts of the gate insulating layer 150 and the insulating interlayer 190, and the drain electrode 230 may be connected to the drain region of the active layer 130 through a contact hole defined by removing second parts of the gate insulating layer 150 and the insulating interlayer 190. Each of the source electrode 210 and the drain electrode 230 may be provided by a metal, a metal alloy, metal nitride, conductive metal oxide, a transparent conductive material, etc., for example, which may be used alone or in combination with each other.

Accordingly, the semiconductor element 250 including the active layer 130, the gate insulating layer 150, the gate electrode 170, the insulating interlayer 190, the source electrode 210, and the drain electrode 230 may be provided.

The metal member 400 may be disposed in the peripheral area 20 on the insulating interlayer 190. In other words, the metal member 400 may be disposed at an outermost portion in the peripheral area 20 on the insulating interlayer 190. The metal member 400 may be provided by at least one of a metal, a metal alloy, metal nitride, conductive metal oxide, a transparent conductive material, etc., for example. In an exemplary embodiment, the metal member 400 may include at least one of Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, etc., for example.

The first power supply line 380 may be disposed in the peripheral area 20 on the insulating interlayer 190 while being spaced apart from the metal member 400 in the first direction D1. In an exemplary embodiment, the first power supply line 380 may be provided by a metal, a metal alloy, metal nitride, conductive metal oxide, a transparent conductive material, etc., for example, which may be used alone or in combination with each other.

The second power supply line 390 may be disposed in the display area 10 on the insulating interlayer 190. The second power supply line 390 may be disposed between the first power supply line 380 and the drain electrode 230 (or the semiconductor element 250) on the insulating interlayer 190. The second power supply line 390 may be provided by a metal, a metal alloy, metal nitride, conductive metal oxide, a transparent conductive material, etc., for example, which may be used alone or in combination with each other.

In the exemplary embodiments, the metal member 400, the first power supply line 380, the second power supply line 390, the source electrode 210, and the drain electrode 230 may be simultaneously disposed in the same layer by the same material. In an exemplary embodiment, the metal member 400, the first power supply line 380, the second power supply line 390, the source electrode 210, and the drain electrode 230 may be simultaneously provided by forming a preliminary electrode layer on the insulating interlayer 190, and selectively etching the preliminary electrode layer, for example.

Figure 6:
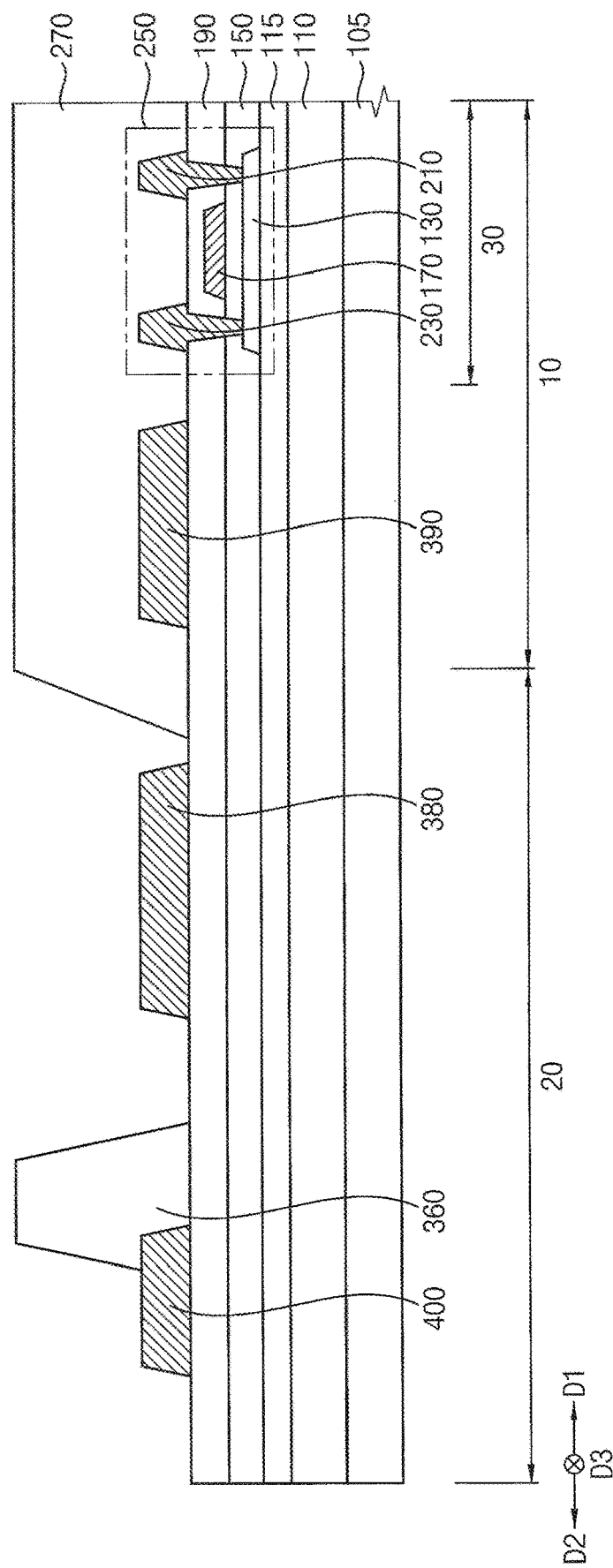

Referring to FIG. 6, the planarization layer 270 may be disposed on the insulating interlayer 190, the second power supply line 390, the source electrode 210, and the drain electrode 230. The planarization layer 270 may have a relatively thick thickness to sufficiently cover the second power supply line 390 and the source and drain electrodes 210 and 230 on the insulating interlayer 190. In this case, the planarization layer 270 may have a substantially flat top surface. In order to implement such a flat top surface of the planarization layer 270, a planarization process may be additionally performed on the planarization layer 270. The planarization layer 270 may be provided by an organic material.

The lower blocking member 360 may be disposed in the peripheral area 20 on the insulating interlayer 190 and a portion of the metal member 400. In other words, the lower blocking member 360 may overlap a portion of the metal member 400. The lower blocking member 360 may include a first side surface 361, a second side surface 362, and a top surface 363 (refer to FIG. 3). The lower blocking member 360 may be provided by an organic material. In an exemplary embodiment, the organic material may include at least one of a photoresist, a polyacryl-based resin, a polyimide-based resin, a polyamide-based resin, a siloxane-based resin, an acryl-based resin, an epoxy-based resin, etc., for example.

In the exemplary embodiments, the planarization layer 270 and the lower blocking member 360 may be simultaneously disposed in the same layer by the same material. In an exemplary embodiment, the planarization layer 270 and the lower blocking member 360 may be simultaneously disposed on the insulating interlayer 190 by forming an organic layer over the insulating interlayer 190, and partially removing the organic layer by a slit mask, a halftone mask, or a halftone slit mask, or the like, for example.

Figure 7:
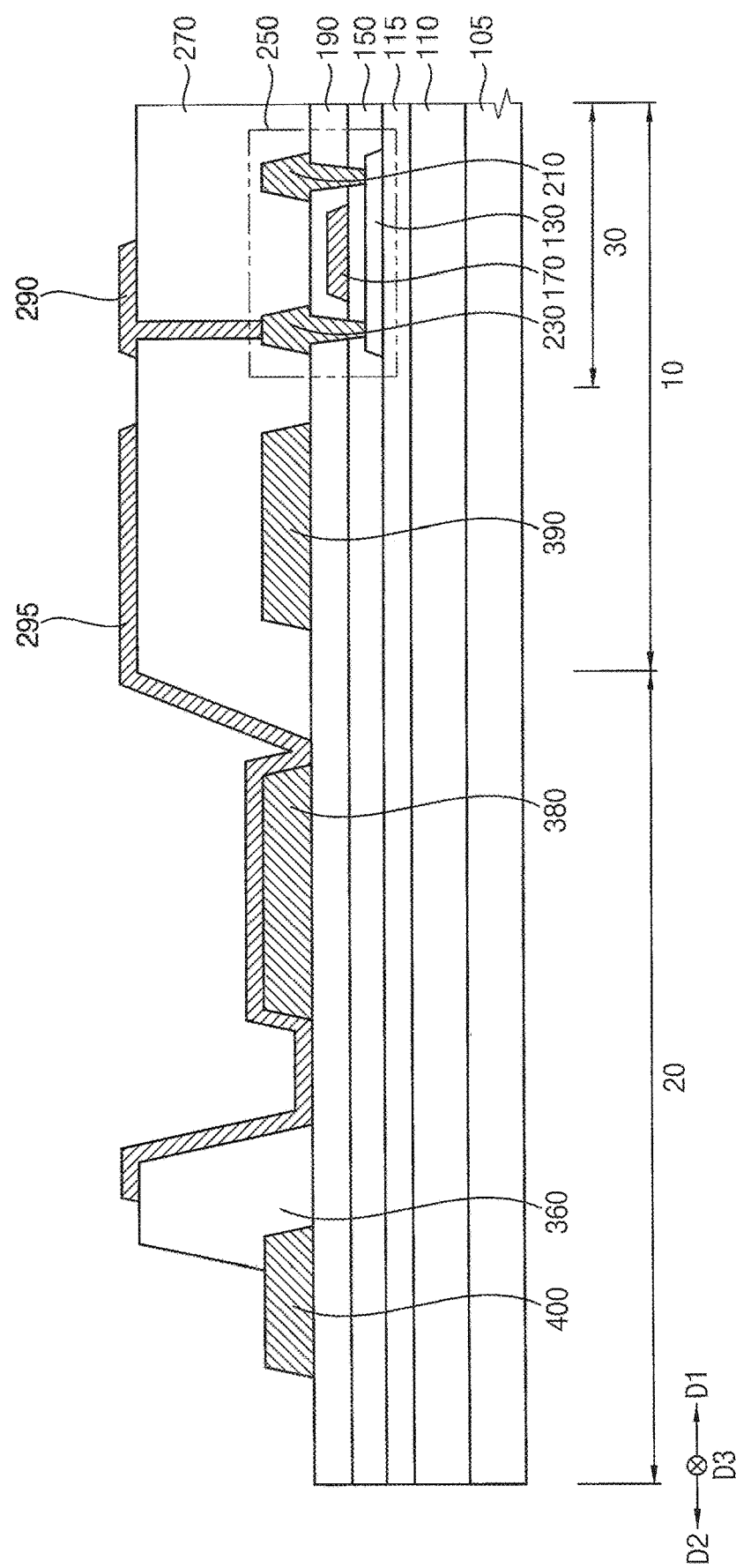

Referring to FIG. 7, the lower electrode 290 may be disposed in the pixel area 30 on the planarization layer 270. The lower electrode 290 may directly contact the drain electrode 230 through a contact hole defined by removing a portion of the planarization layer 270. The lower electrode 290 may be provided by a metal, a metal alloy, metal nitride, conductive metal oxide, a transparent conductive material, etc., for example, which may be used alone or in combination with each other.

The connection electrode 295 may be disposed on the planarization layer 270, the first power supply line 380, and a portion of the top surface 363 of the lower blocking member 360. In other words, the connection electrode 295 may be spaced apart from the lower electrode 290 on the planarization layer 270 to extend in the second direction D2, and the connection electrode 295 may be disposed in the display area 10 and the peripheral area 20 adjacent to the boundary between the display area 10 and the peripheral area 20 on the substrate 110. The connection electrode 295 may be disposed in the peripheral area 20 on the first side surface 361 and a portion of the top surface 363 of the lower blocking member 360. The connection electrode 295 may be provided by a metal, a metal alloy, metal nitride, conductive metal oxide, a transparent conductive material, etc., for example, which may be used alone or in combination with each other.

In the exemplary embodiments, the lower electrode 290 and the connection electrode 295 may be simultaneously provided by the same material. In an exemplary embodiment, the lower electrode 290 and the connection electrode 295 may be simultaneously provided by forming a preliminary electrode layer over the insulating interlayer 190, the lower blocking member 360, and the planarization layer 270, and partially etching the preliminary electrode layer, for example.

Figure 8:
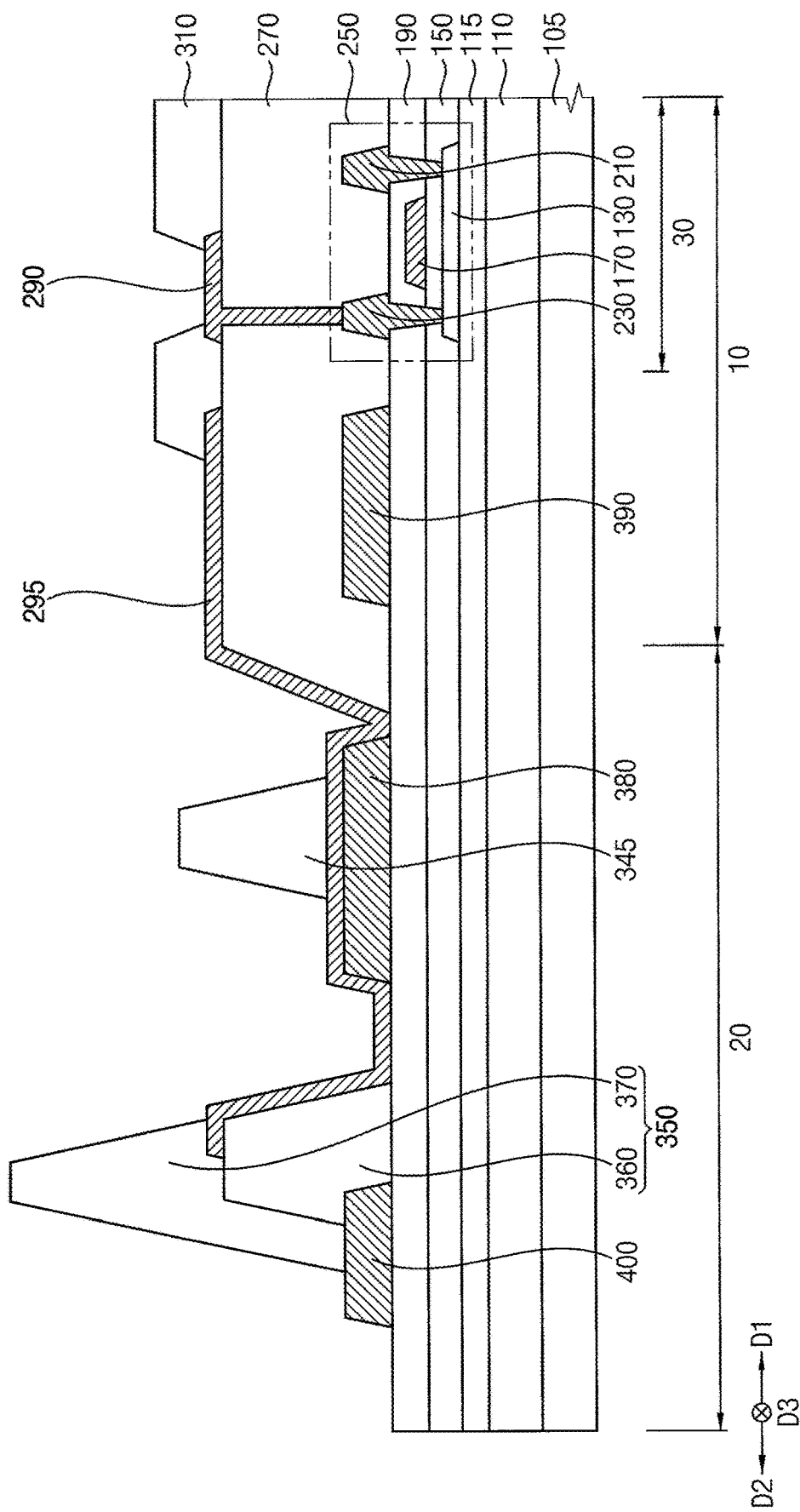

Referring to FIG. 8, the pixel defining layer 310 may be disposed on a portion of the lower electrode 290, a portion of the connection electrode 295, and the planarization layer 270. The pixel defining layer 310 may cover both sides of the lower electrode 290, and an opening which exposes a portion of the top surface of the lower electrode 290 may be defined in the pixel defining layer 310. The pixel defining layer 310 may be provided by an organic material.

The upper blocking member 370 may be disposed on the metal member 400, the lower blocking member 360, and a portion of the connection electrode 295. In other words, the upper blocking member 370 may be disposed on the top surface 363 and the second side surface 362 of the lower blocking member 360, and the bottom surface of the upper blocking member 370 disposed on the second side surface 362 of the lower blocking member 360 may contact the metal member 400. The upper blocking member 370 may be provided by an organic material.

The second blocking structure 345 may be disposed in the peripheral area 20 on the connection electrode 295. In other words, the second blocking structure 345 may be disposed on a portion of the connection electrode 295 under which the first power supply line 380 is disposed while being spaced apart from the first side surface 361 of the lower blocking member 360 in the first direction D1 on the substrate 110. The second blocking structure 345 may be provided by an organic material.

In the exemplary embodiments, the pixel defining layer 310, the second blocking structure 345, and the upper blocking member 370 may be simultaneously provided by the same material. In an exemplary embodiment, the upper blocking member 370, the second blocking structure 345, and the pixel defining layer 310 may be simultaneously disposed on the substrate 110 by forming an organic layer over the substrate 110, and partially removing the organic layer by a slit mask, a halftone mask, a halftone slit mask, or the like, for example. In this case, a height of a top surface of the upper blocking member 370 may be higher than a height of each of top surfaces of the second blocking structure 345 and the pixel defining layer 310.

Accordingly, the first blocking structure 350 including the lower blocking member 360 and the upper blocking member 370 may be provided.

Figure 9:
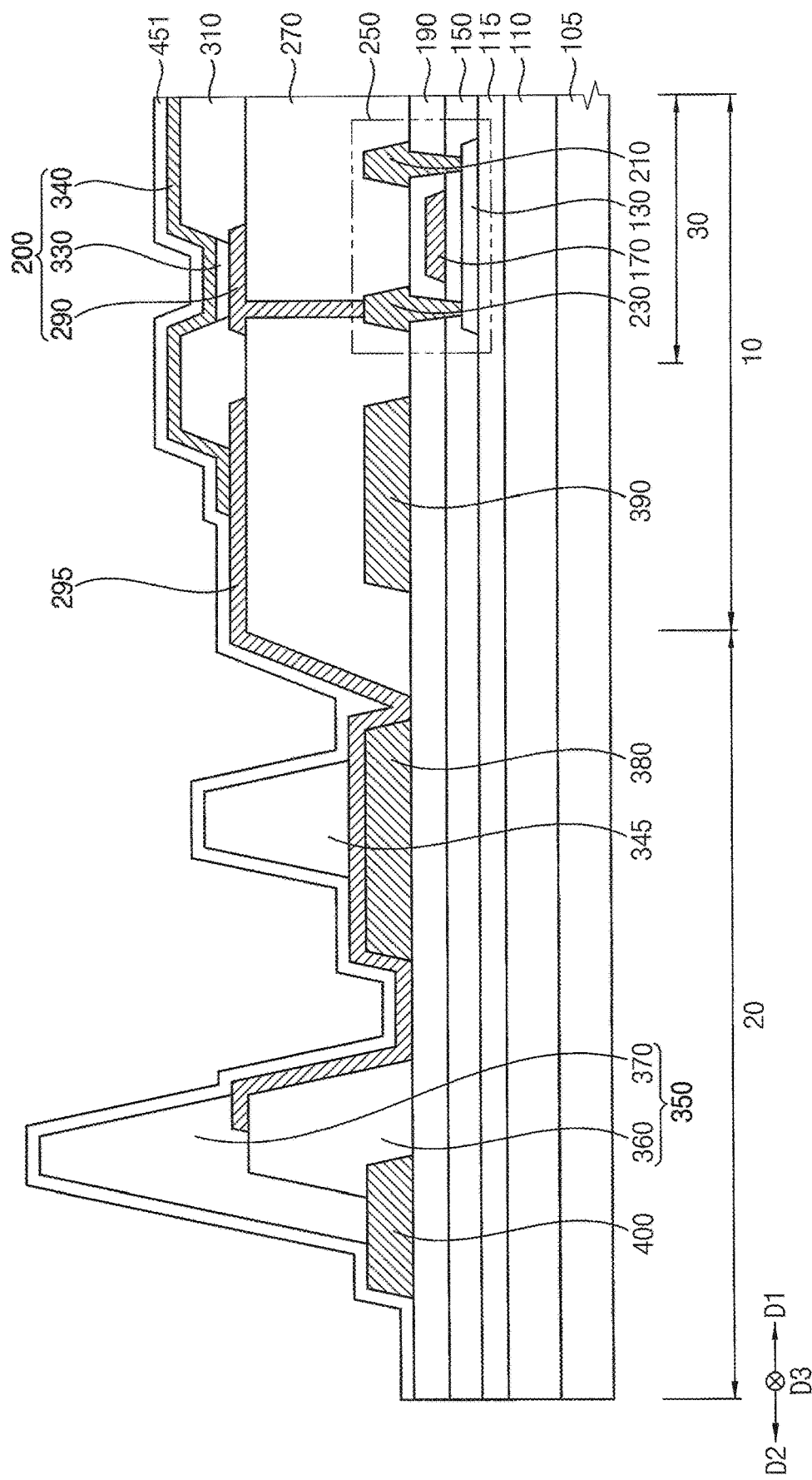

Referring to FIG. 9, the light emitting layer 330 may be disposed on the lower electrode 290 exposed by the opening of the pixel defining layer 310. The light emitting layer 330 may be provided by at least one of light emitting materials for emitting different color lights (i.e., red light, green light, blue light, etc.) according to sub-pixels. In an alternative exemplary embodiment, the light emitting layer 330 may be provided by stacking a plurality of light emitting materials for emitting different color lights such as red light, green light, and blue light to emit white light as a whole. In this case, a color filter may be disposed on the light emitting layer 330. In an exemplary embodiment, the color filter may be provided by at least one of a red color filter, a green color filter, and a blue color filter, for example, but is not limited thereto. The color filter may be provided by a photosensitive resin or a color photoresist.

The upper electrode 340 may be disposed on the pixel defining layer 310 and the light emitting layer 330. The upper electrode 340 may be disposed over the display area 10 on the substrate 110 to cover the light emitting layer 330 and the pixel defining layer 310. The upper electrode 340 may be provided by a metal, a metal alloy, metal nitride, conductive metal oxide, a transparent conductive material, etc., for example, which may be used alone or in combination with each other.

Accordingly, the pixel structure 200 including the lower electrode 290, the light emitting layer 330, and the upper electrode 340 may be provided.

The first inorganic thin film encapsulation layer 451 may be disposed on the upper electrode 340, the connection electrode 295, the first blocking structure 350, the second blocking structure 345, the insulating interlayer 190, and the like. The first inorganic thin film encapsulation layer 451 may be disposed along a profile of the upper electrode 340, the connection electrode 295, the first blocking structure 350, and the second blocking structure 345 with a uniform thickness to cover the upper electrode 340, the connection electrode 295, the first blocking structure 350, and the second blocking structure 345. The first inorganic thin film encapsulation layer 451 may be provided by inorganic materials having flexibility.

Figure 10:
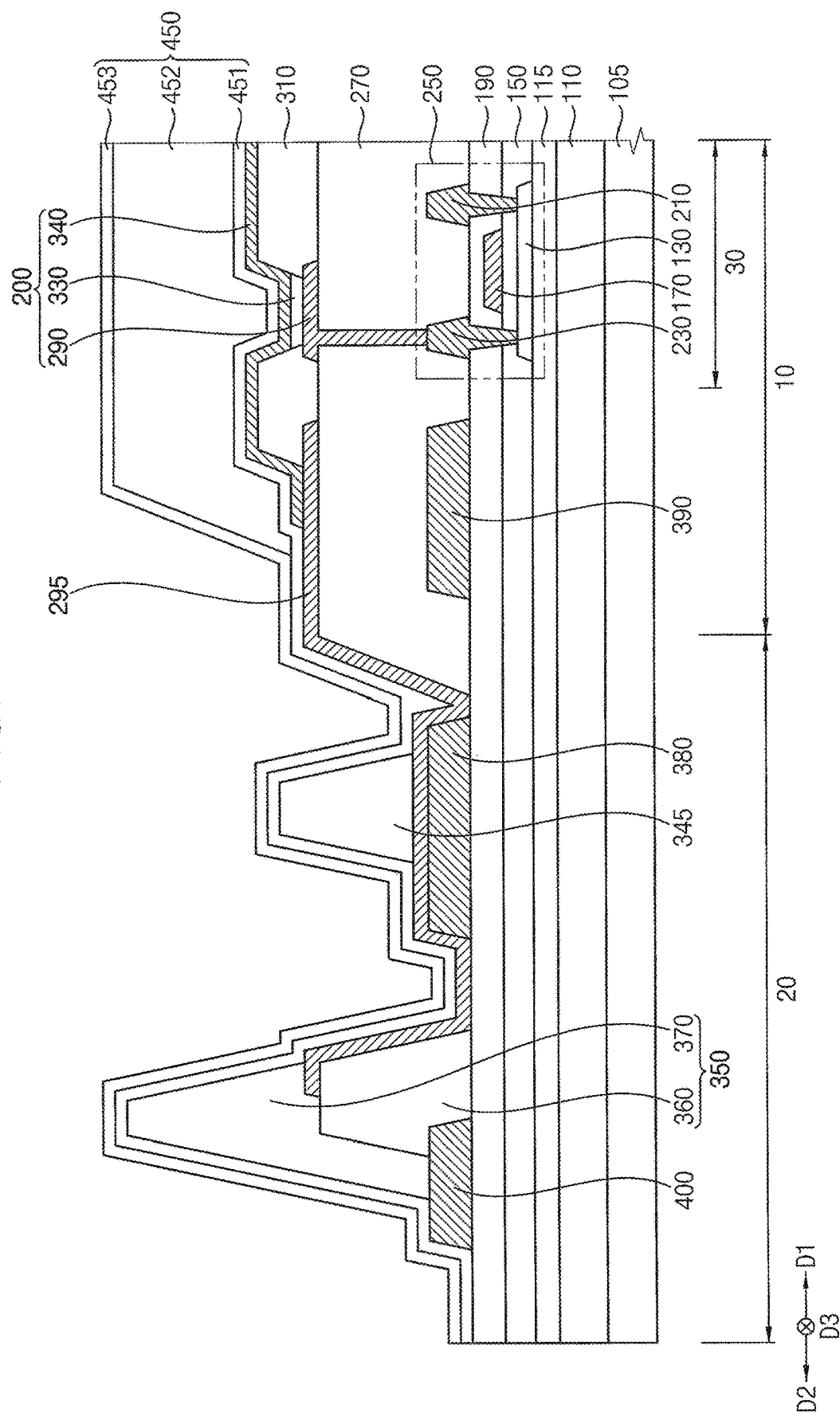

Referring to FIGS. 10 and 2, the organic thin film encapsulation layer 452 may be disposed on the first inorganic thin film encapsulation layer 451. The organic thin film encapsulation layer 452 may be provided by organic materials having flexibility.

The second inorganic thin film encapsulation layer 453 may be disposed on the organic thin film encapsulation layer 452. The second inorganic thin film encapsulation layer 453 may be disposed along a profile of the first inorganic thin film encapsulation layer 451 and the organic thin film encapsulation layer 452 with a uniform thickness to cover the organic thin film encapsulation layer 452. The second inorganic thin film encapsulation layer 453 may be provided by inorganic materials having flexibility.

Accordingly, the thin film encapsulation structure 450 including the first inorganic thin film encapsulation layer 451, the organic thin film encapsulation layer 452, and the second inorganic thin film encapsulation layer 453 may be provided.

After the thin film encapsulation structure 450 is disposed, the glass substrate 105 may be delaminated from the substrate 110. Accordingly, the organic light emitting diode display device 100 shown in FIG. 2 may be manufactured.

Figure 11:
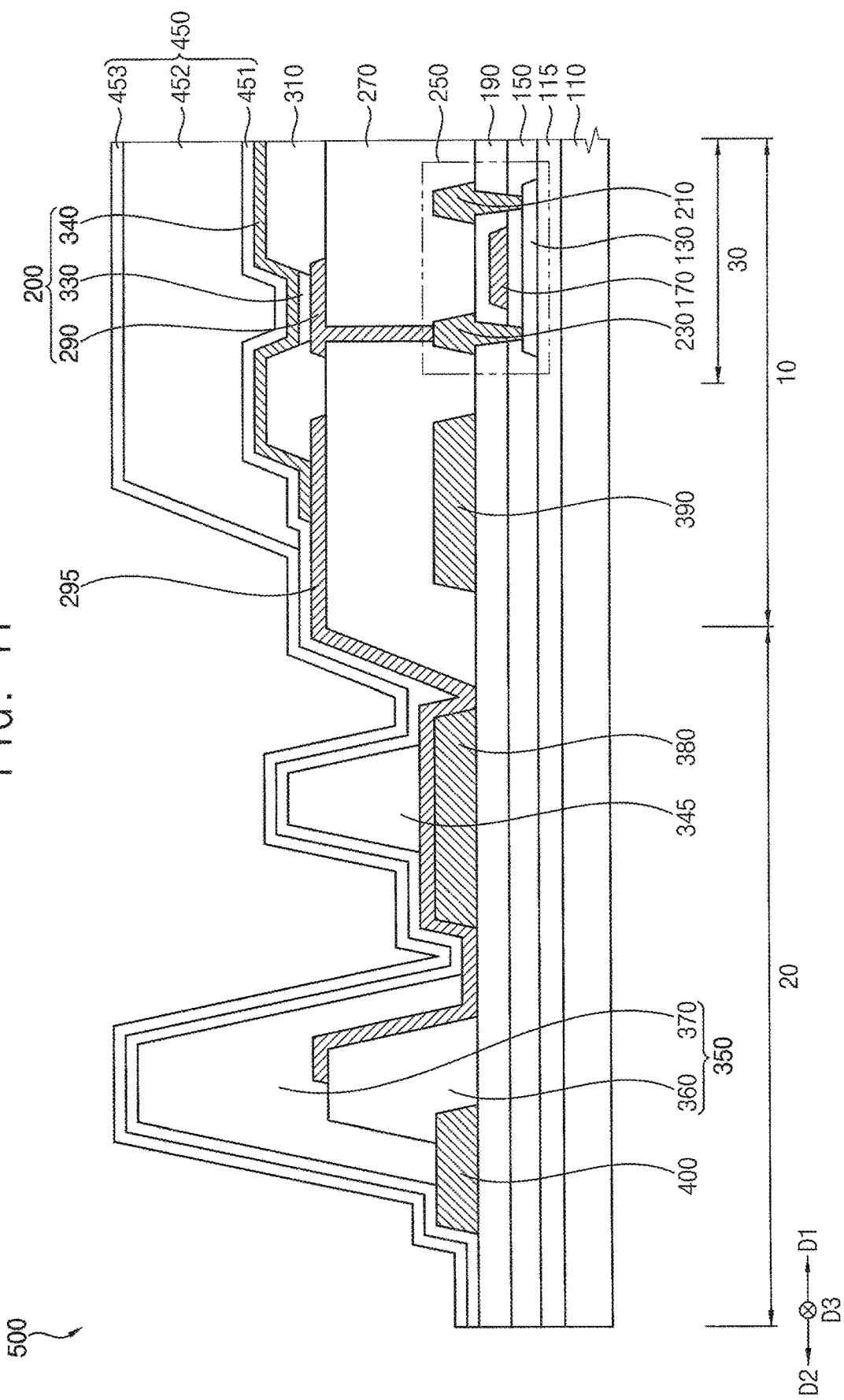
FIG. 11 is a cross-sectional view showing an exemplary embodiment of an organic light emitting diode display device according to the invention.

FIG. 11 is a cross-sectional view showing an exemplary embodiment of an organic light emitting diode display device according to the invention. An organic light emitting diode display device 500 illustrated in FIG. 11 may have a configuration substantially identical or similar to the configuration of the organic light emitting diode display device 100 described with reference to FIGS. 1 to 3 except for a shape of the upper blocking member 370. In FIG. 11, redundant descriptions of components substantially identical or similar to the components described with reference to FIGS. 1 to 3 will be omitted.

Referring to FIG. 11, the organic light emitting diode display device 500 may include a substrate 110, a buffer layer 115, a semiconductor element 250, a first power supply line 380, a second power supply line 390, a metal member 400, a planarization layer 270, a first blocking structure 350, a second blocking structure 345, a pixel structure 200, a connection electrode 295, a pixel defining layer 310, a thin film encapsulation structure 450, and the like. In this case, the first blocking structure 350 may include a lower blocking member 360 and an upper blocking member 370. In addition, as shown in FIG. 3, the lower blocking member 360 may include a first side surface 361, a second side surface 362 opposite to the first side surface 361, and a top surface 363 disposed between the first side surface 361 and the second side surface 362, and the first side surface 361 may be adjacent to the pixel structure 200.

The upper blocking member 370 may be disposed on the metal member 400, the lower blocking member 360, and the connection electrode 295. The upper blocking member 370 may completely overlap the lower blocking member 360 in a plan view such that the lower blocking member 360 may be prevented from being exposed. In other words, the upper blocking member 370 may be disposed on the top surface 363, the first side surface 361, and the second side surface 362 of the lower blocking member 360. In an exemplary embodiment, a first bottom surface of the upper blocking member 370 disposed on the first side surface 361 of the lower blocking member 360 may contact the connection electrode 295, and a second bottom surface of the upper blocking member 370 disposed on the second side surface 362 of the lower blocking member 360 may contact the metal member 400, for example.

In the exemplary embodiments, the first and second bottom surfaces of the upper blocking member 370 contact a metal (e.g., the metal member 400 and the connection electrode 295) without contacting an inorganic insulating layer (e.g., the insulating interlayer 190), so that the lower blocking member 360 may be prevented from being separated.

Figure 12:
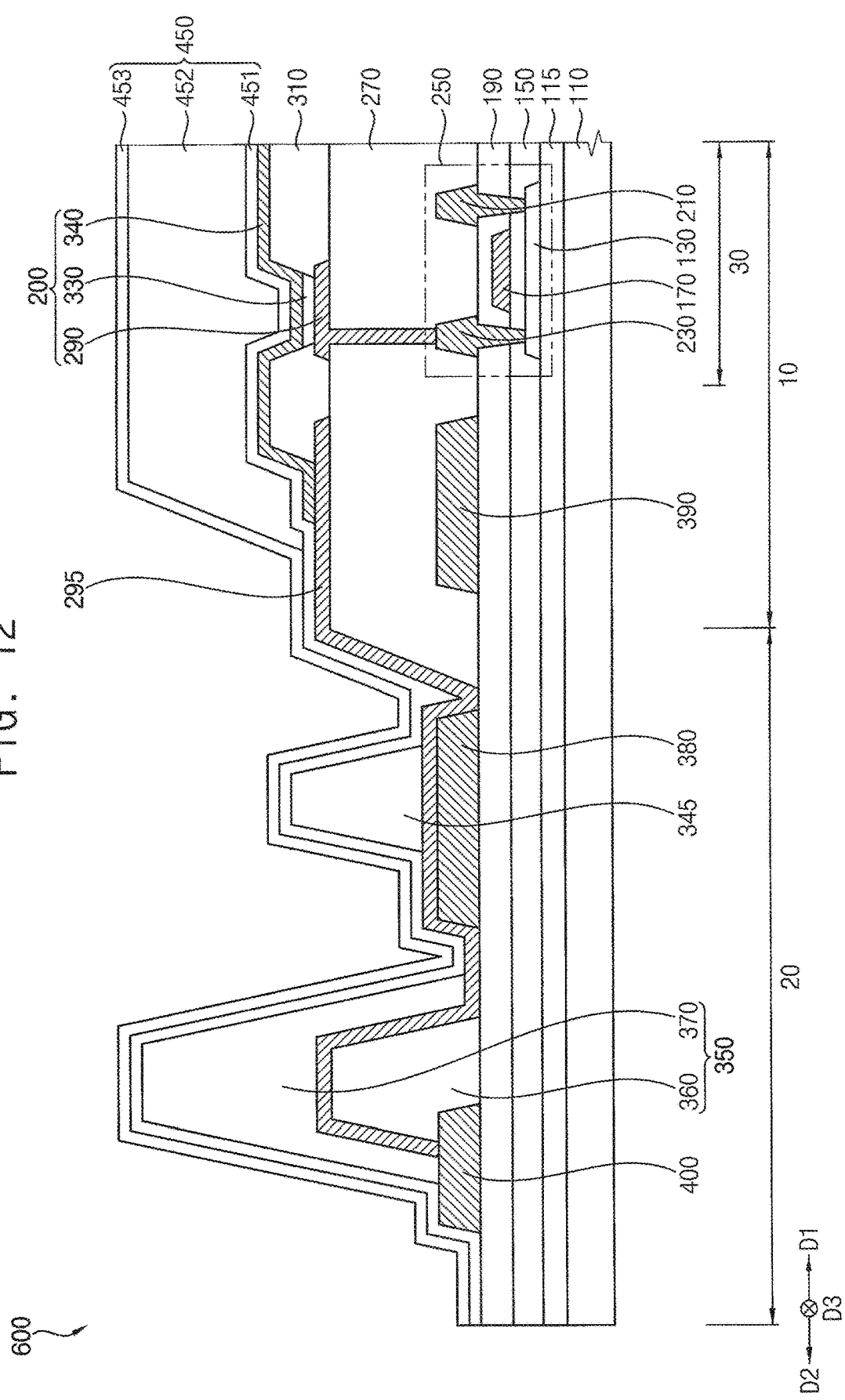
FIG. 12 is a cross-sectional view showing an exemplary embodiment of an organic light emitting diode display device according to the invention.

FIG. 12 is a cross-sectional view showing an exemplary embodiment of an organic light emitting diode display device according to the invention. An organic light emitting diode display device 600 illustrated in FIG. 12 may have a configuration substantially identical or similar to the configuration of the organic light emitting diode display device 500 described with reference to FIG. 11 except for a shape of the connection electrode 295. In FIG. 12, redundant descriptions of components substantially identical or similar to the components described with reference to FIG. 11 will be omitted.

Referring to FIG. 12, the organic light emitting diode display device 600 may include a substrate 110, a buffer layer 115, a semiconductor element 250, a first power supply line 380, a second power supply line 390, a metal member 400, a planarization layer 270, a first blocking structure 350, a second blocking structure 345, a pixel structure 200, a connection electrode 295, a pixel defining layer 310, a thin film encapsulation structure 450, and the like. In this case, the first blocking structure 350 may include a lower blocking member 360 and an upper blocking member 370. In addition, as shown in FIG. 3, the lower blocking member 360 may include a first side surface 361, a second side surface 362 opposite to the first side surface 361, and a top surface 363 disposed between the first side surface 361 and the second side surface 362, and the first side surface 361 may be adjacent to the pixel structure 200.

The connection electrode 295 may be disposed on the planarization layer 270, the first power supply line 380, and the top surface 363, the first side surface 361, and the second side surface 362 of the lower blocking member 360. In other words, the connection electrode 295 may be spaced apart from the lower electrode 290 on the planarization layer 270 to extend in the second direction D2 opposite to the first direction D1, and the connection electrode 295 may be disposed in the display area 10 and the peripheral area 20 adjacent to the boundary between the display area 10 and the peripheral area 20 on the substrate 110. The connection electrode 295 may be interposed between the second blocking structure 345 and the first power supply line 380 in the peripheral area 20, and may extend in the second direction D2 so that the connection electrode 295 may be interposed between the lower blocking member 360 and the upper blocking member 370. In other words, the connection electrode 295 may be disposed on the first side surface 361, the second side surface 362, and the top surface 363 of the lower blocking member 360. In the exemplary embodiments, the connection electrode 295 may contact the metal member 400. In other words, the connection electrode 295 may completely overlap the lower blocking member 360 in a plan view such that the lower blocking member 360 may be prevented from being exposed.

In the exemplary embodiments, the connection electrode 295 is disposed on a substantially entire portion of the bottom surface of the upper blocking member 370, so that adhesion between the upper blocking member 370 and the connection electrode 295 may be relatively increased. In addition, the connection electrode 295 contacts the metal member 400, so that a wiring resistance of the connection electrode 295 may be relatively reduced.

Figure 13:
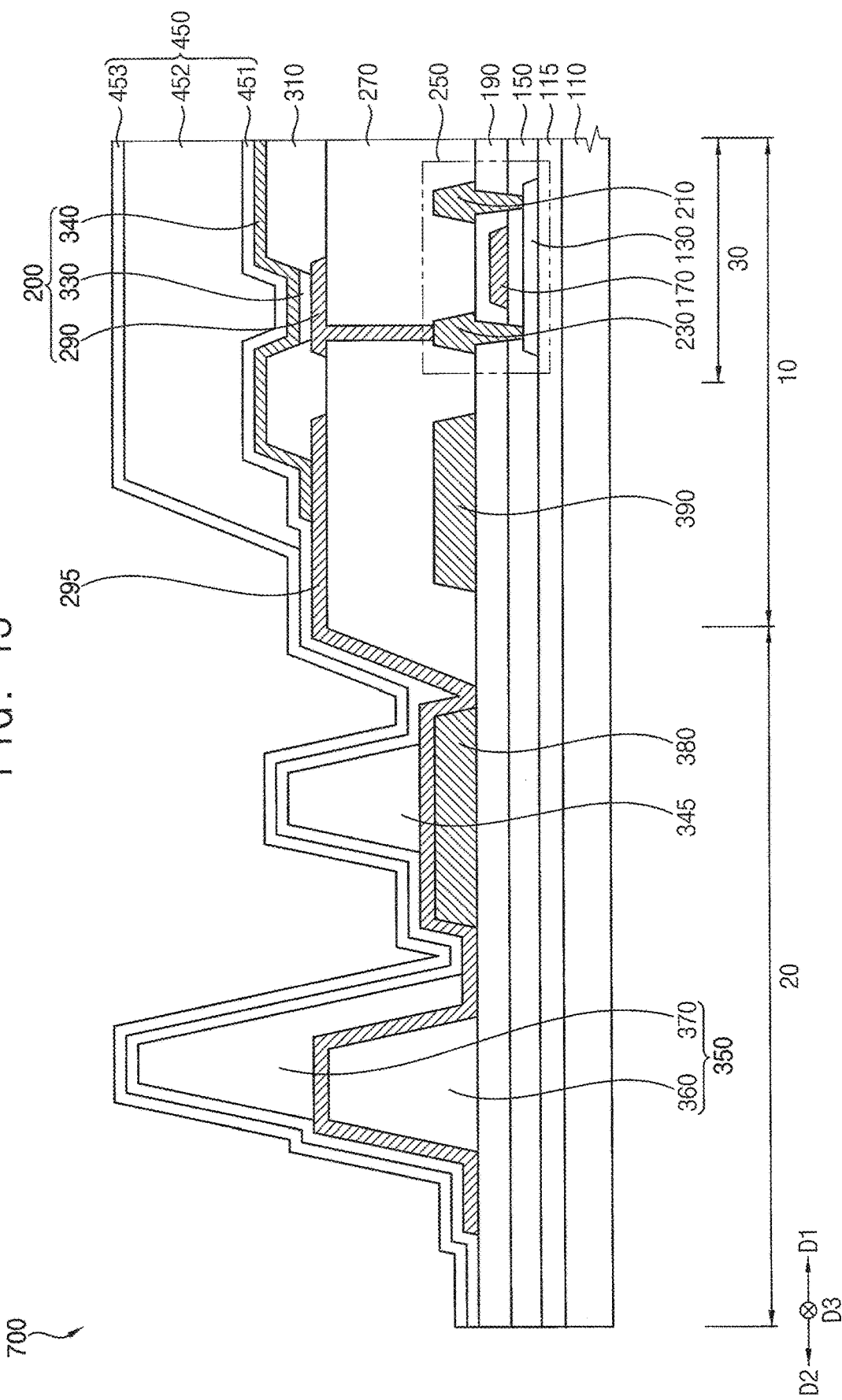
FIG. 13 is a cross-sectional view showing an exemplary embodiment of an organic light emitting diode display device according to the invention.

FIG. 13 is a cross-sectional view showing an exemplary embodiment of an organic light emitting diode display device according to the invention.

Referring to FIG. 13, an organic light emitting diode display device 700 may include a substrate 110, a buffer layer 115, a semiconductor element 250, a first power supply line 380, a second power supply line 390, a planarization layer 270, a first blocking structure 350, a second blocking structure 345, a pixel structure 200, a connection electrode 295, a pixel defining layer 310, a thin film encapsulation structure 450, and the like. In this case, the pixel structure 200 may include a lower electrode 290, a light emitting layer 330, and an upper electrode 340, and the semiconductor element 250 may include an active layer 130, a gate insulating layer 150, a gate electrode 170, an insulating interlayer 190, a source electrode 210, and a drain electrode 230. In addition, the thin film encapsulation structure 450 may include a first inorganic thin film encapsulation layer 451, an organic thin film encapsulation layer 452, and a second inorganic thin film encapsulation layer 453, and the first blocking structure 350 may include a lower blocking member 360 and an upper blocking member 370. Moreover, as shown in FIG. 3, the lower blocking member 360 may include a first side surface 361, a second side surface 362 opposite to the first side surface 361, and a top surface 363 disposed between the first side surface 361 and the second side surface 362, and the first side surface 361 may be adjacent to the pixel structure 200.

The organic light emitting diode display device 700 may include the display area 10 including the pixel areas 30 and the peripheral area 20 surrounding the display area 10. An image may be displayed through the pixel structure 200 in the pixel area 30, and the first blocking structure 350, the second blocking structure 345, the wires, and the like may be disposed in the peripheral area 20 which may correspond to a non-display area. A plurality of transistors (e.g., the semiconductor element 250), a plurality of capacitors, a plurality of wires, and the like may be additionally disposed in the display area 10. The organic light emitting diode display device 700 includes a flexible substrate 110 and the thin film encapsulation structure 450, so that the organic light emitting diode display device 700 may function as a flexible organic light emitting diode display device.

The connection electrode 295 may be disposed on the planarization layer 270, the first power supply line 380, and the lower blocking member 360. In other words, the connection electrode 295 may be spaced apart from the lower electrode 290 on the planarization layer 270 to extend in the second direction D2, and the connection electrode 295 may be disposed in the display area 10 and the peripheral area 20 adjacent to the boundary between the display area 10 and the peripheral area 20 on the substrate 110. The connection electrode 295 may be interposed between the second blocking structure 345 and the first power supply line 380 in the peripheral area 20, and may extend in the second direction D2 so that the connection electrode 295 may be interposed between the lower blocking member 360 and the upper blocking member 370. In other words, the connection electrode 295 may be disposed on the first side surface 361, the second side surface 362, and the top surface 363 of the lower blocking member 360. In the exemplary embodiments, the connection electrode 295 may completely overlap the lower blocking member 360 in a plan view such that the lower blocking member 360 may be prevented from being exposed.

The upper blocking member 370 may be disposed on the lower blocking member 360, and a portion of the connection electrode 295. In other words, the upper blocking member 370 may extend in the first direction D1 on the top surface 363 of the lower blocking member 360 so as to be disposed on the first side surface 361 of the lower blocking member 360, and the bottom surface of the upper blocking member 370 disposed on the first side surface 361 of the lower blocking member 360 may contact the connection electrode 295. The upper blocking member 370 may serve to block the leakage of the organic thin film encapsulation layer 452 together with the lower blocking member 360. The upper blocking member 370 may include an organic material or an inorganic material. In the exemplary embodiments, the upper blocking member 370 may include an organic material.

The organic light emitting diode display device 700 in the exemplary embodiments of the invention includes the connection electrode 295 which completely overlaps the lower blocking member 360 in a plan view, so that the bottom surface of the upper blocking member 370 may contact the top surface of the connection electrode 295, and the upper blocking member 370 may not contact the insulating interlayer 190. Accordingly, the delamination phenomenon may be prevented from occurring.

Figure 14:
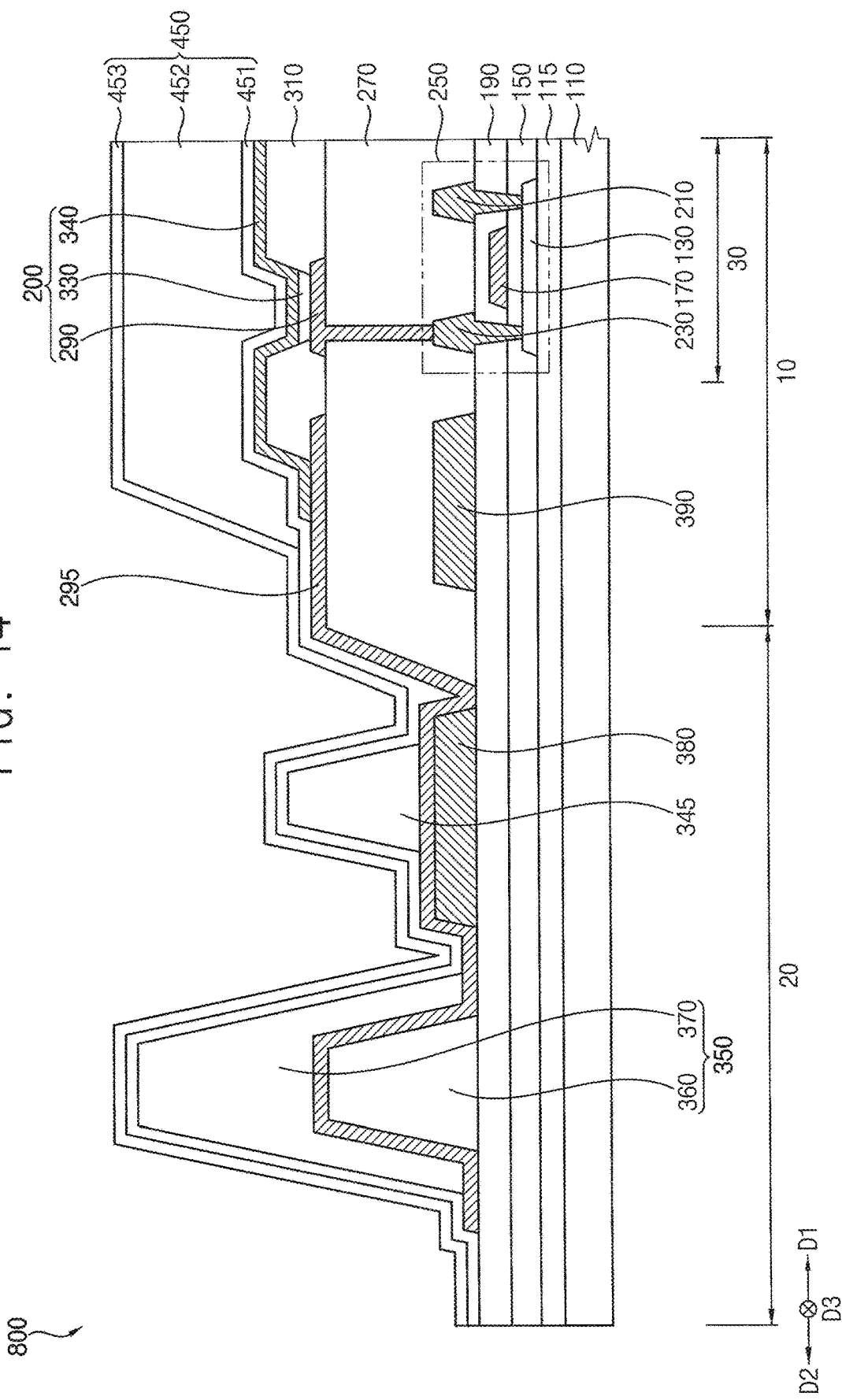
FIG. 14 is a cross-sectional view showing an exemplary embodiment of an organic light emitting diode display device according to the invention.

FIG. 14 is a cross-sectional view showing an exemplary embodiment of an organic light emitting diode display device according to the invention. An organic light emitting diode display device 800 illustrated in FIG. 14 may have a configuration substantially identical or similar to the configuration of the organic light emitting diode display device 700 described with reference to FIG. 13 except for a shape of the upper blocking member 370. In FIG. 14, redundant descriptions of components substantially identical or similar to the components described with reference to FIG. 13 will be omitted.

Referring to FIG. 14, the organic light emitting diode display device 800 may include a substrate 110, a buffer layer 115, a semiconductor element 250, a first power supply line 380, a second power supply line 390, a planarization layer 270, a first blocking structure 350, a second blocking structure 345, a pixel structure 200, a connection electrode 295, a pixel defining layer 310, a thin film encapsulation structure 450, and the like. In this case, the first blocking structure 350 may include a lower blocking member 360 and an upper blocking member 370. In addition, as shown in FIG. 3, the lower blocking member 360 may include a first side surface 361, a second side surface 362 opposite to the first side surface 361, and a top surface 363 disposed between the first side surface 361 and the second side surface 362, and the first side surface 361 may be adjacent to the pixel structure 200.

The upper blocking member 370 may be disposed on the connection electrode 295. The upper blocking member 370 may completely overlap the lower blocking member 360 in a plan view such that the lower blocking member 360 may be prevented from being exposed. In other words, the upper blocking member 370 may extend in the first direction D1 on the top surface 363 of the lower blocking member 360 so as to be disposed on the first side surface 361 of the lower blocking member 360, and may extend in the second direction D2 on the top surface 363 of the lower blocking member 360 so as to be disposed on the second side surface 362 of the lower blocking member 360. That is, the upper blocking member 370 may be disposed on the top surface 363, the first side surface 361, and the second side surface 362 of the lower blocking member 360. In an exemplary embodiment, a first bottom surface of the upper blocking member 370 disposed on the first side surface 361 of the lower blocking member 360 and a second bottom surface of the upper blocking member 370 disposed on the second side surface 362 of the lower blocking member 360 may contact the connection electrode 295, for example.

In the exemplary embodiments, the first and second bottom surfaces of the upper blocking member 370 contact a metal (e.g., the metal member 400 and the connection electrode 295) without contacting an inorganic insulating layer (e.g., the insulating interlayer 190), so that the lower blocking member 360 may be prevented from being separated.

Figure 15:
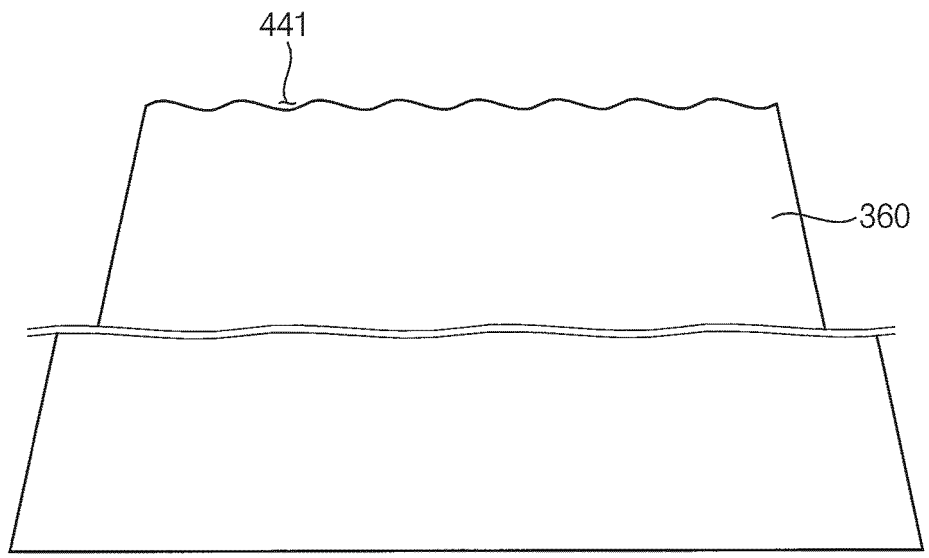
FIG. 15 is a cross-sectional view showing an exemplary embodiment of a lower blocking member included in the organic light emitting diode display device of FIGS. 13 and 14.
Figure 16:
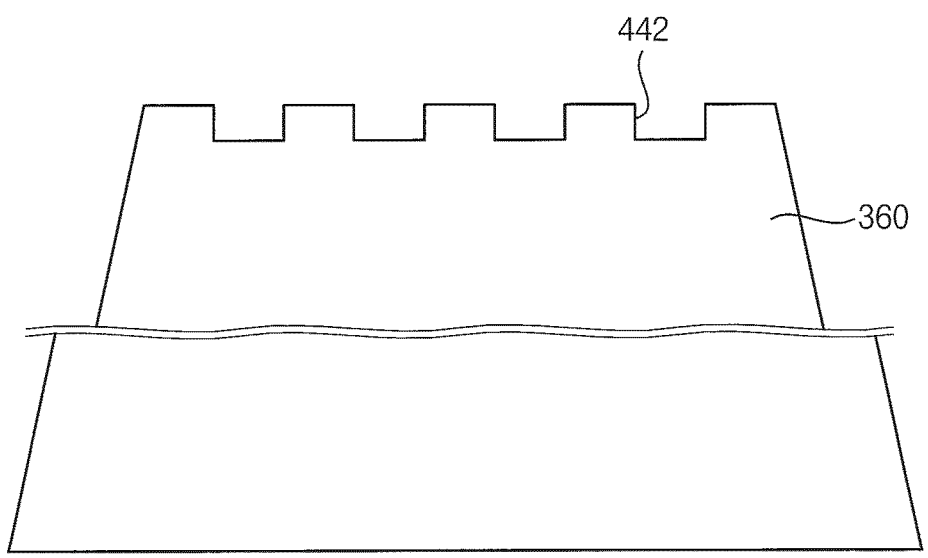
FIG. 16 is a cross-sectional view showing another exemplary embodiment of a lower blocking member included in the organic light emitting diode display device of FIGS. 13 and 14.

FIG. 15 is a cross-sectional view showing one exemplary embodiment of a lower blocking member included in the organic light emitting diode display device of FIGS. 13 and 14, and FIG. 16 is a cross-sectional view showing another exemplary embodiment of a lower blocking member included in the organic light emitting diode display device of FIGS. 13 and 14.

Referring to FIGS. 13, 14, 15, and 16, in a process of manufacturing the lower blocking member 360, the top surface of the lower blocking member 360 may be provided so as to be non-uniform by a halftone slit mask. In the exemplary embodiments, as shown in FIG. 15, a plurality of grooves 441 may be defined in the top surface of the lower blocking member 360. In an alternative exemplary embodiment, as shown in FIG. 16, a concavo-convex portion 442 may be defined on the top surface of the lower blocking member 360. In this case, the connection electrode 295 disposed on the lower blocking member 360 may be disposed along a profile of the top surface 363 of the lower blocking member 360, so that a groove 441 or a concavo-convex portion 442 may be defined in the connection electrode 295 overlapping the top surface 363 of the lower blocking member 360. When the upper blocking member 370 is disposed on the groove 441 or the concavo-convex portion 442 of the connection electrode 295, a contact area between the connection electrode 295 and the upper blocking member 370 may be relatively increased. Accordingly, the upper blocking member 370 may be prevented from being separated from the connection electrode 295.

The invention may be applied to various electronic devices including an organic light emitting diode display device. In exemplary embodiments, the invention may be applied to vehicle-display device, a ship-display device, an aircraft-display device, portable communication devices, display devices for display or for information transfer, a medical-display device, etc., for example.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting diode display device comprising:
    a substrate including a display area and a peripheral area;
    a pixel structure disposed in the display area on the substrate;
    a lower blocking member disposed in the peripheral area on the substrate and surrounding the pixel structure, the lower blocking member including a first side surface adjacent to the pixel structure, a second side surface opposite to the first side surface, and a top surface disposed between the first side surface and the second side surface;
    an upper blocking member disposed on the top surface and the second side surface of the lower blocking member, the upper blocking member constituting a first blocking structure together with the lower blocking member; and
    a metal member disposed between the first blocking structure and the substrate and contacts a bottom surface of the upper blocking member disposed on the second side surface of the lower blocking member.

2. The organic light emitting diode display device of claim 1, further comprising an insulating interlayer disposed between the first blocking structure and the substrate, the insulating interlayer including an inorganic material,
    wherein the metal member is disposed between the bottom surface of the upper blocking member and the insulating interlayer and prevents the bottom surface of the upper blocking member from contacting the insulating interlayer.

3. The organic light emitting diode display device of claim 1, further comprising a second blocking structure disposed in the peripheral area while being spaced apart from the first side surface of the lower blocking member in a first direction, which is a direction from the peripheral area to the display area, on the substrate.

4. The organic light emitting diode display device of claim 3, further comprising a first power supply line disposed between the second blocking structure and the substrate.

5. The organic light emitting diode display device of claim 4, further comprising a connection electrode disposed between the second blocking structure and the first power supply line, the connection electrode extending in a second direction opposite to the first direction and disposed on the first side surface and at least a portion of the top surface of the lower blocking member.

6. The organic light emitting diode display device of claim 5, wherein the upper blocking member extends in the first direction and is disposed on the first side surface of the lower blocking member, and
    the bottom surface of the upper blocking member is disposed on the first side surface of the lower blocking member and contacts the connection electrode.

7. The organic light emitting diode display device of claim 6, wherein the upper blocking member completely overlaps the lower blocking member in a plan view such that the lower blocking member is prevented from being exposed.

8. The organic light emitting diode display device of claim 5, wherein the connection electrode extends in the second direction and is disposed on the second side surface of the lower blocking member, and
    the connection electrode contacts the metal member.

9. The organic light emitting diode display device of claim 8, wherein the connection electrode completely overlaps the lower blocking member in a plan view such that the lower blocking member is prevented from being exposed.

10. The organic light emitting diode display device of claim 5, further comprising:
    a semiconductor element disposed in the display area while being spaced apart from the first power supply line in the first direction on the substrate; and
    a second power supply line disposed between the first power supply line and the semiconductor element on the substrate.

11. The organic light emitting diode display device of claim 10, wherein the pixel structure includes:
    a lower electrode disposed on the semiconductor element;
    a light emitting layer disposed on the lower electrode; and
    an upper electrode disposed on the light emitting layer, and
    the connection electrode extends in the first direction to contact the upper electrode.

12. The organic light emitting diode display device of claim 11, further comprising:
- a first inorganic thin film encapsulation layer disposed on the upper electrode, the first blocking structure, and the second blocking structure;
- an organic thin film encapsulation layer disposed on the first inorganic thin film encapsulation layer; and
- a second inorganic thin film encapsulation layer disposed on the first inorganic thin film encapsulation layer and the organic thin film encapsulation layer, the second inorganic thin film encapsulation layer constituting a thin film encapsulation structure together with the first inorganic thin film encapsulation layer and the organic thin film encapsulation layer.

13. An organic light emitting diode display device comprising:
- a substrate including a display area and a peripheral area;
- a pixel structure disposed in the display area on the substrate;
- a lower blocking member disposed in the peripheral area on the substrate and surrounding the pixel structure, the lower blocking member including a first side surface adjacent to the pixel structure, a second side surface opposite to the first side surface, and a top surface disposed between the first side surface and the second side surface;
- an upper blocking member disposed on the lower blocking member, the upper blocking member constituting a first blocking structure together with the lower blocking member; and
- a connection electrode disposed on the first side surface and the top surface of the lower blocking member while being disposed between the lower blocking member and the upper blocking member, the connection electrode completely overlapping the top surface of the lower blocking member in a plan view.

14. The organic light emitting diode display device of claim 13, wherein the upper blocking member extends in a first direction, which is a direction from the peripheral area to the display area, and is disposed on the first side surface of the lower blocking member, and a bottom surface of the upper blocking member disposed on the first side surface of the lower blocking member contacts the connection electrode.

15. The organic light emitting diode display device of claim 14, wherein the connection electrode extends in a second direction opposite to the first direction and is disposed on the second side surface of the lower blocking member.

16. The organic light emitting diode display device of claim 15, wherein the connection electrode completely overlaps the lower blocking member in the plan view such that the lower blocking member is prevented from being exposed.

17. The organic light emitting diode display device of claim 15, wherein the upper blocking member extends in the second direction and is disposed on the second side surface of the lower blocking member, and
- the bottom surface of the upper blocking member is disposed on the second side surface of the lower blocking member and contacts the connection electrode.

18. The organic light emitting diode display device of claim 17, wherein the upper blocking member completely overlaps the lower blocking member in the plan view such that the lower blocking member is prevented from being exposed.

19. The organic light emitting diode display device of claim 13, further comprising an insulating interlayer disposed between the first blocking structure and the substrate, the insulating interlayer including an inorganic material,
- wherein the connection electrode is disposed between a bottom surface of the upper blocking member and the insulating interlayer and prevents the bottom surface of the upper blocking member from contacting the insulating interlayer.

20. The organic light emitting diode display device of claim 13, wherein a plurality of grooves is defined in the top surface of the lower blocking member.

* * * * *